United States Patent
Bashark

[54] ELECTRONIC CONTROL FOR AN APPLIANCE

[75] Inventor: Larry T. Bashark, St. Joseph Township, Berrien County, Mich.

[73] Assignee: Whirlpool Corporation, Benton Harbor, Mich.

[21] Appl. No.: 692,332

[22] Filed: Apr. 26, 1991

Related U.S. Application Data

[60] Division of Ser. No. 397,755, Aug. 23, 1989, Pat. No. 5,038,091, which is a continuation-in-part of Ser. No. 392,473, Aug. 11, 1989, abandoned, which is a continuation-in-part of Ser. No. 392,368, Aug. 11, 1989, abandoned.

[51] Int. Cl.$^5$ .................. B30B 15/22; H02P 1/40
[52] U.S. Cl. .................. 318/751; 318/817; 318/455; 318/286; 100/229 A
[58] Field of Search .............. 318/257, 817, 751, 455, 318/785, 795, 786, 722, 729, 775, 778, 779, 786, 806, 809, 812, 822, 798, 286, 727, 681, 799, 434–438, 232; 68/12 R, 133, 134; 100/229 A

[56] References Cited

U.S. PATENT DOCUMENTS

| | | | |
|---|---|---|---|
| 3,337,756 | 8/1967 | Mendenhall | 307/141.4 |
| 3,918,359 | 11/1975 | Hennells et al. | 100/229 A |
| 4,379,986 | 4/1983 | Baxter et al. | 318/434 |
| 4,436,030 | 3/1984 | Ciciora | 100/229 A |
| 4,481,786 | 11/1984 | Bashark | 318/438 |
| 4,555,654 | 11/1985 | Spradling et al. | 318/817 |
| 4,781,111 | 11/1988 | Chesnut | 100/229 A |
| 4,804,911 | 2/1989 | Petesiss et al. | 318/796 |
| 4,809,600 | 3/1989 | Yamamato et al. | 100/229 A |

Primary Examiner—William M. Shoop, Jr.
Assistant Examiner—John W. Cabeca
Attorney, Agent, or Firm—Stephen D. Krefman; Thomas J. Roth; Thomas E. Turcotte

[57] ABSTRACT

An electronic control for a motor which eliminates the motor centrifugal switch and more particularly a control for a domestic refuse compactor which permits the user to control the approximate full trash bag weight and obtain more compaction from a split phase induction drive motor. A ferrite core sensor on the main winding of the drive motor samples the lagging phase angle of the motor main winding current during a compaction stroke. A low force cycle is achieved by terminating the stroke as soon as phase samples fall below a threshold defined at the start of each cycle by a locked motor main winding phase sample acquired prior to starting the motor. A medium force cycle terminates the stroke when compaction forces exceed the main winding breakdown torque. A high force cycle is achieved by re-activating a motor start winding when compaction forces exceed the main winding breakdown torque and terminating the stroke as soon as the phase samples exceed a threshold defined at the start of each cycle during motor starting. The control uses programmed referencing techniques to eliminate factory pre-calibration.

65 Claims, 17 Drawing Sheets

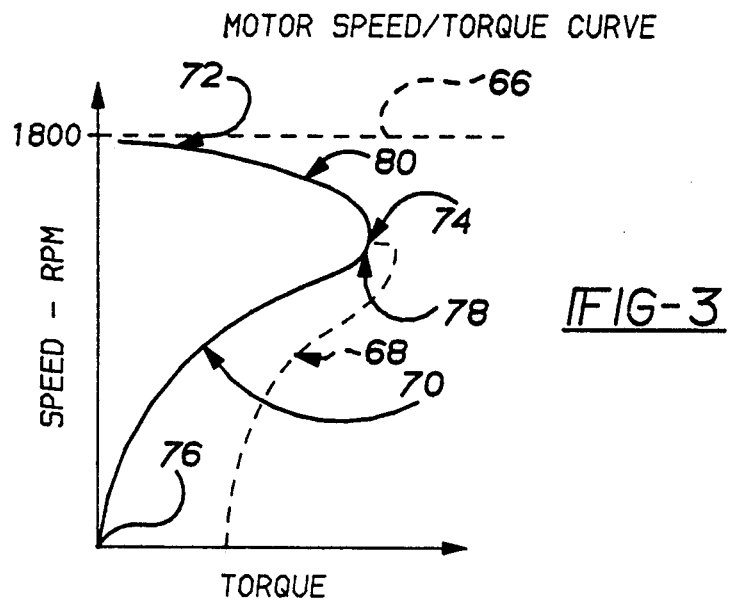
FIG-3 MOTOR SPEED/TORQUE CURVE
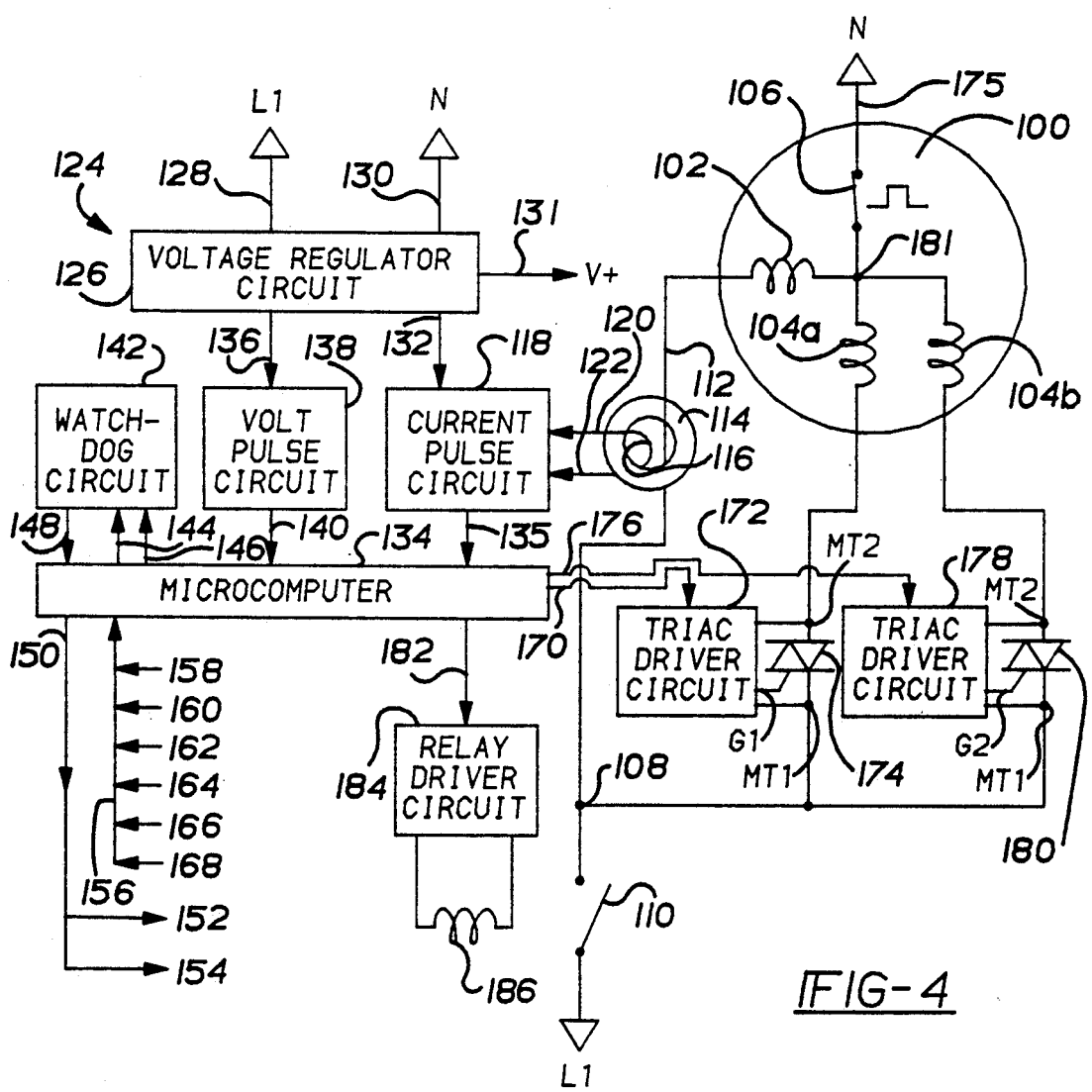
FIG-4

ELECTRONIC CONTROL FOR AN APPLIANCE

CROSS REFERENCE TO RELATED APPLICATIONS

This is a division of application Ser. No. 07/397,755, filed Aug. 23, 1989 now U.S. Pat. No. 5,038,091.

This application is a continuation-in-part of two applications both entitled "Electronic Control For an Automatic Washing Machine With a Reversing PSC Motor" having U.S. Ser. Nos. 392,473 and 392,368, both filed Aug. 11, 1989 by the same inventor as in the present application, both now abandoned. Both parent applications disclose control circuitry and logic similar tot hat of the present application.

BACKGROUND OF THE PRESENT INVENTION

The present invention is directed to a control for an appliance and more particularly to an electronic control for a compactor having a split-phase induction drive motor.

In a conventional refuse compactor, a ram is driven into a refuse disposal compartment to compact trash disposed therein and continues advancing until the motor stalls. The ram is subsequently driven out of the refuse disposal compartment. Various drive mechanisms for refuse compactors are disclosed in U.S. Pat. No. 3,353,478 to Stephen Hawkin; U.S. Pat. No. 3,732,805 to Jerry W. Moon; U.S. Pat. No. 3,772,987 to Charles R. Difley; U.S. Pat. No. 3,839,954 to Joseph F. Burgeois; U.S. Pat. No. 3,921,515 to William A. Eckerle; U.S. Pat. No. 4,007,678 to John K. C. Gustavson, et. al.; U.S. Pat. No. 4,188,877 to Aman U. Khan; and U.S. Pat. No. 4,565,125 to Aman U. Khan.

Various mechanical and electronic controls have been designed for regulating the operation of the drive mechanisms of a trash compactor. For example, Einar O. Engebretsen shows a compactor cycle control in U.S. Pat. No. 3,962,964 wherein a dwell period is provided at the end of the compaction cycle.

U.S. Pat. No. 3,855,919, Richard W. Potter shows a control system for a compacting apparatus including signal lamps for showing the direction of movement of the ram. The apparatus includes a time delay circuit for automatically shutting down the compactor when any of the operational cycles thereof continues beyond a predetermined time limit.

In U.S. Pat. No. 3,398,433 of Charles J. Borum, a trash compactor with a clock timer control is disclosed for providing an extended delay period after a compacting stroke. The clock is provided to permit the automatic extended compaction at a period of time during the day when the compactor is unlikely to be in use for a substantial length of time. The control operates the ram independently of any manual initiation of the apparatus to effect the compacting stroke at the predetermined time and to cause the stopping of the ram for the delay period during that independently initiated compaction stroke. In U.S. Pat. No. 3,543,676 of Gordon H. Brown, another refuse compactor is shown having control circuitry for regulating the operation of the compactor automatically.

Michael J. Bottas et al, in U.S. Pat. No. 3,613,560, show a refuse compactor including a control circuit which permits operation of the ram only when the drawer is substantially in the compacting position. The control circuit includes a tilt switch which is arranged in the circuit to permit reverse withdrawal movement of the ram by depression of a manually operable pushbutton.

Jerome F. Stratman et al, in U.S. Pat. No. 3,821,927 show a refuse compactor control system having a lower limit switch connected in parallel with a centrifugal switch.

In U.S. Pat. No. 3,831,513 of Philip Tashman, a portable solid waste compactor is shown having a compacting ram which has a stroke varying with the reaction force of the waste material being compacted therein. An interlock associated with the ram prevents operation of the compactor upon removal of the container in which the refuse is compacted. A guard gate is automatically closed across the refuse chute opening upon downward compacting movement of the ram to prevent injury to the operator's hand. If the guard gate is prevented from closing by an obstruction, a switch causes immediate reversal of the ram to its uppermost position.

In U.S. Pat. No. 4,062,282, Samuel Jacob Miller et al show a refuse compactor having a tilt switch for terminating operation of the compacting ram in the event of a preselected tilt movement of the receptacle during the compacting operation. Means are provided for preventing movement of the receptacle sufficient to open the receptacle safety switch during the compacting operation thereby preventing discontinuation of energization of the ram motor during the compaction cycle which could immobilize the compactor apparatus in midcycle.

While these prior art control patents teach that it is desirable to monitor performance of a compactor to determine, for example, when compaction is complete or when the bag is full, the prior art uses multiple sensors, typically mechanical sensors, to monitor the operation. Furthermore, the maximum torque applied is limited to the main winding breakdown torque.

A more generic control system for various appliances having an AC induction drive motor, including examples of an automatic washing machine, a dryer, an air conditioner, a refrigerator, and a dishwasher, is shown in my U.S. Pat. No. 4,481,786, assigned to the assignee of the present invention. That control system employs a ferrite core sensor having a primary winding that is formed of two turns of the drive motor's run winding, the sensor having a single turn secondary winding that forms a sense winding coupled to a motor phase monitoring circuit. The sense winding provides a signal representing a polarity change in the run winding current. The current polarity change signal is used by the motor phase monitoring circuit to provide a voltage compensated motor phase angle pulse to a microcomputer for the appliance to control various operations of the appliance. More particularly, a digital representation of the motor phase angle pulse is used by the microcomputer to monitor the starting of the drive motor by detecting a characteristic decrease in the motor phase representation. The motor phase angle representation is further used by the microcomputer of an automatic washing machine to determine the agitator torque which is in turn used by the microcomputer to automatically control the water level of the washing machine. An average motor torque number is also determined from the motor phase angle representation wherein the average motor torque number is used to provide an end of drain control for the washing machine.

While my prior patent application suggests that the control may be used to control any AC induction motor controlling any appliance, including a split phase induction motor controlling a trash compactor, the applicability or desirability of such a control to the specific needs of a compactor was neither addressed nor considered. The present invention is directed to a control utilizing some of the teachings of my aforementioned U.S. patent to a refuse compactor but applying a novel circuit and novel logic to detect the onset of stalling as the ram compacts the refuse and using that information to control the operation of a compactor in a novel way.

SUMMARY OF THE INVENTION

The present invention provides a control for a split phase induction motor that detects the onset of stalling and temporarily boosts the torque of the motor in order to perform more work at precisely the time when the motor is beginning to stall. In particular, the control provides more torque to the ram of a refuse compactor at the time when the ram of the compactor engages the refuse and begins to stall as a result of the resistance of the refuse to compaction.

The present invention also provides a force level control for a compactor that permits manual selection from three different force levels which result in three different compaction rates.

The preferred embodiment of the present invention provides a control for refuse compactor with a split-phase induction drive motor. The control includes a ferrite core sensor on the main winding of the drive motor sampling circuitry sampling the lagging phase angle of the motor main winding current at a predetermined sample rate through a refuse compaction stroke, a selector for manually selecting high, medium or low compaction force, a controller selectively operable to obtain medium force by terminating the stroke when the compaction force exceeds the main winding breakdown torque, a controller for selectively applying a high force by selectively reactivating the start winding of the motor instead of terminating the cycle, and a controller selectively operable to obtain a low force by terminating the stroke of the ram when the phase sample falls below a predetermined threshold level. The predetermined threshold level for the low force cycle is preferably defined at the start of each cycle by a locked rotor main winding phase sample acquired prior to starting the motor.

The present invention further provides a control for a refuse compactor that monitors the phase angle of a motor winding and determines a no load and a full bag condition.

In the preferred embodiment, the present invention provides a control for a refuse compactor having a ram driven by a split phase induction drive motor. The control includes sampling circuitry sampling the lagging phase angle of the motor main winding current during the compaction stroke, a controller detecting the onset of compaction from the lagging phase angle information, such that a no load condition is detected by the failure to detect compaction after a first predetermined time and such that a full bag condition is detected by the detection of compaction by a second predetermined time.

It is therefore the primary object of the present invention to provide a reliable refuse compactor control for a refuse compactor with a split-phase induction drive motor.

It is another object of the present invention to provide a compactor control providing two or ore force level selections to thereby allow the user to control the approximate full trash bag weight.

It is still another object of the present invention to provide a control for a refuse compactor that applies or selectively applies increased torque and thereby provides increased compaction at the onset of compaction than was previously available from the motor.

It is yet another object of the present invention to provide a control for refuse compactor that detects the onset of compaction without the use of a centrifugal switch.

It is another object of the present invention to provide a control for a refuse compactor that monitors the characteristics of a motor winding to determine the onset of compaction, as well as a no load and a full bag condition.

It is a further object of the present invention to provide an electronic control for a split phase induction motor that temporarily activates the start winding of the motor up on the onset of a motor stalling condition such as to boost the torque of the motor at the time of peak load on the motor where the onset of stalling is detected by monitoring the lagging phase angle of the motor main winding.

These and other objects, advantages and features of the present invention will become apparent to those skilled in the art upon review of the following description of the preferred embodiment in conjunction with the drawings appended.

BRIEF DESCRIPTION OF THE DRAWINGS

In the drawing wherein like reference numerals refer to like components throughout:

FIG. 3 is a characteristic speed-torque curve for a split-phase induction motor controlled by electronic control of the present invention;

FIG. 4 is a schematic circuit showing a domestic refuse compactor control, according to the present invention, for controlling the compactor of FIGS. 1 and 2;

DESCRIPTION OF THE PREFERRED EMBODIMENT

Figure 1:
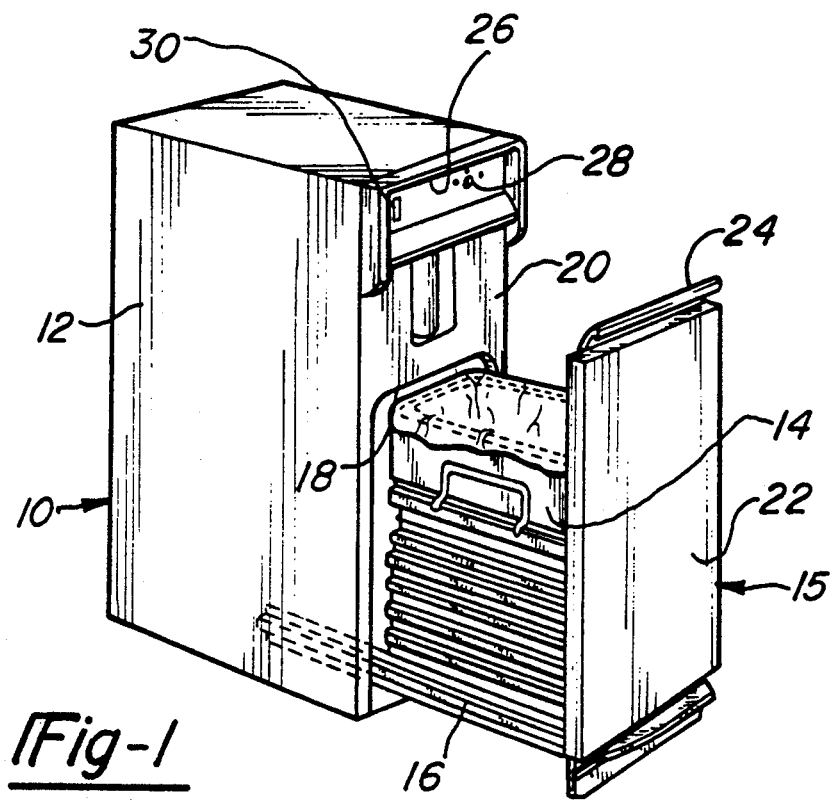
FIG. 1 is a perspective view of a conventional type of refuse compactor having an electronic control according to the present invention.

A conventional type of refuse compactor 10, to which the present invention is a adaptable, is illustrated in FIG. 1. The refuse compactor 10 and its mechanical components are well known in the art and are therefore not described in great detail herein. The compactor 10 comprises a generally rectangular cabinet 12 which encloses a drawer assembly 15 including a refuse disposal receptacle 14 translatable along guide rails 16 in drawer-like fashion through an opening 18 in the front wall 20 of the cabinet 12 to situate the receptacle 14 selectively in either the FIG. 1 position for accepting refuse or within the cabinet 12. The receptacle 14 is integral with and manually controlled through a handle 24 mounted on a front drawer panel 22. A control panel 26 is mounted on the upper portion of the front wall 20 to operate the compactor. The control panel 28 includes a novel cycle selector 28 and a start button 30, described later in detail.

Figure 2:
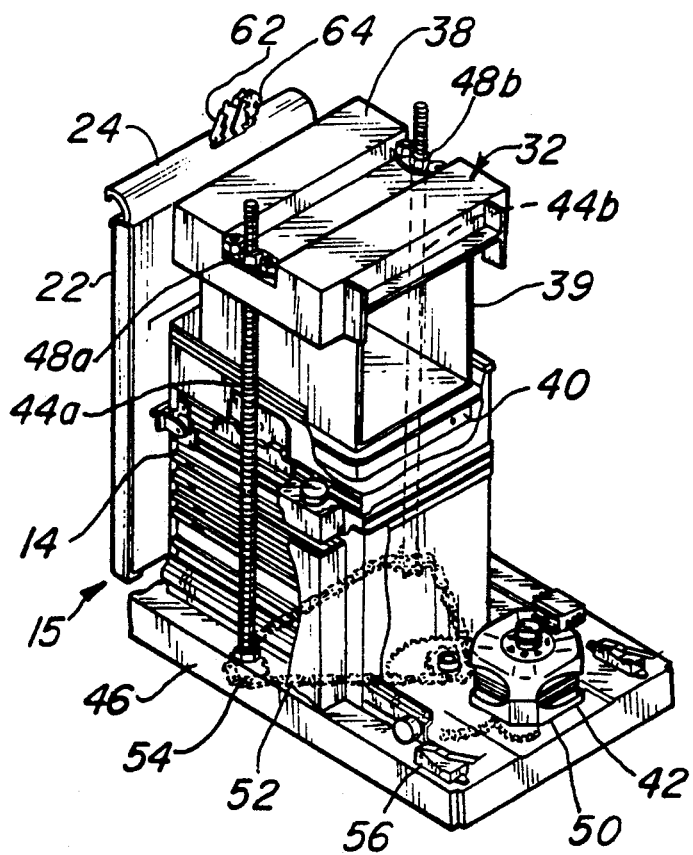
FIG. 2 is a partly schematic and partly cutaway perspective view of the refuse compactor of FIG. 1 with the cabinet removed.

A ram assembly 32 of the compactor 10 is depicted in FIG. 2. The ram assembly 32 includes a metal ram top member 38. A ram cover 40 with a refuse engaging surface is suspended beneath the ram top member 40 by a ram housing 39, as is well known in the art. The ram assembly 32 is forcibly driven by means of a drive assembly 42 associated with the base 46 of the compactor. The ram assembly 32 is coupled to the drive assembly 42 through a suitable connection which includes vertical power screws 44a and 44b. The lower end of each power screw is journaled in a suitable conventional bearing (not shown) at the base 46 of the compactor. The power screws 44a and 44b each threadably couples with a floating drive nut assembly including power nut 48a and 48b, respectively, fixed against the upper surface of ram top member 38. A exemplary ram assembly of the type described above is disclosed in U.S. Pat. No. 4,565,125.

The drive assembly 42 includes a motor 50, driving a chain connected to a moving sprocket gear 54 at the bottom of each of the power screws 44a and 44b. An exemplary drive assembly of the type described is disclosed in U.S. Pat. No. 4,188,877. In operation, the drive assembly 42 forcibly reciprocates the ram assembly 32 into and out of the refuse receptacle 14 to compress the refuse therein.

And as is well known, the refuse compactor 10 may be provided with a variety of mechanical sensors and switches including a drawer safety switch 56, a drawer tilt switch 58 and a drive motor centrifugal switch 60, a top limit switch 62, and a directional switch 64. However, in the preferred embodiment of the present invention, the centrifugal switch 60 and the direction switch 64 are omitted since their functions are obtained from the software described later herein.

In the preferred embodiment of the present invention, the motor 50 is a split-phase induction drive motor with separate clockwise and counter-clockwise auxiliary windings and with no centrifugal switch. The present invention utilizes the characteristic relationships between the motor speed, the torque, and the main winding phase angle to monitor and control the operation of the refuse compactor. The operation of the control of the present invention is best understood by appreciating these characteristic relationships.

When a single phase induction motor, having one or more split phase auxiliary windings, is operating on the main run winding, the alternating main winding current lags the alternating voltage across the main winding. The phase lag, or angle, by which the main winding current lags the voltage is inversely related to the motor output torque. Thus, with a lightly loaded split phase induction motor, the alternating main winding current lags the voltage by a large phase angle. If the load torque is gradually increased, the corresponding phase lag of the main winding current with respect to the voltage will decrease until the load torque exceeds the motor breakdown torque, whereupon the motor will begin to stall. When the motor stalls, the main winding phase angle increases somewhat as the motor speed decreases toward zero RPM.

The situation changes, however, when the same split phase induction motor is being operated with both the main winding and the auxiliary winding energized, as is the case, say, when the motor is starting. With both the main and the auxiliary windings energized, the main winding phase angle starts out large and decreases with increasing motor speed. Thus, as the motor is accelerated from zero RPM with both main and auxiliary windings energized, the main winding phase angle decreases as the motor comes up speed. Conversely, if the motor is stalled with both the main and the auxiliary winding energized, the main winding phase angle will start out small and increase as the motor speed decreases.

These relationships are used by the present invention to provide distinct low, medium and high compaction forces for a domestic refuse compactor in a manner described in detail later herein. It is the motor main winding phase angle that is being measured, not the total motor current. It will be appreciated by those skilled in the art that during those times when neither auxiliary winding is energized, the main winding current is also the total motor current and the main winding phase angle is also the total motor phase angle.

It should be noted that the preferred embodiment of the present invention does not use phase angle control. It is the natural main winding phase angle that is being sampled. A ferrite core sensor is used to provide a timing signal in response to the main winding current zero-crossings, not in response to the magnitude of the main winding current.

A representative speed-torque curve for a four-pole split phase induction motor of the type used by the present invention is shown graphically in FIG. 3. The graph illustrates the synchronous speed line 66, the starting torque curve 68 and the operating torque curve 70. The starting torque curve 68 represents the torque available when both the main and the auxiliary winding are energized in parallel. The operating torque crew 70 represents the torque for the motor running on the main winding only.

When the motor is running under a very light load as at point 72, the main winding phase angle is comparatively large. As the motor load torque is increased toward the breakdown torque at maximum torque point 74, the main winding phase angle decreases to a minimum. If the motor is allowed to stall while running on the main winding only, the main winding phase angle at stall shown at point 76, will be higher than the minimum main winding phase angle at point 80, but not as high as the lightly loaded point 72. If the proper auxiliary winding is activated at an activation point 78 near the maximum torque point 74 instead of allowing the motor to stall on the main winding alone, the available motor torque will temporarily increase beyond the maximum main winding breakdown torque at point 74. The motor will follow the starting torque curve 68 as the motor stalls. The main winding phase angle will abruptly decrease to a low value when the auxiliary winding is activated and increase as the motor speed drops due to load torque in excess of the available motor torque.

The present invention uses this principal to obtain a higher torque than is otherwise possible from the motor. Furthermore, the present invention uses the phase angle information to selectively provide other torque levels from the motor in a manner to be disclosed shortly.

Referring now to FIG 4, a schematic circuit showing a domestic refuse compactor control, according to the present invention, with a split phase induction motor, ferrite core sensor, two motor auxiliary winding TRIACs, two TRIAC driver circuits, cycle relay, relay driver circuit, voltage regulator circuit, watchdog circuit, volt pulse circuit, current pulse circuit, microcomputer, and, various binary microcomputer inputs and outputs, described in detail below.

As shown in FIG. 4, a split phase induction motor 100 has a thermal overload protector 106, a main, or run, winding 102 and two auxiliary windings 104a and 104b which are used to start the motor 100 in the clockwise ("CW") or counterclockwise ("CCW") directions, respectively. When the motor 100 is started in the CW direction by the combined main 102 and auxiliary winding 104a, the assembly ram 32 moves in the down, or refuse compaction, direction. When the motor 100 is started in the CCW direction by the combined main 102 and auxiliary winding 104b, the ram assembly 32 moves in the up direction toward the home, or storage, position. The main winding 102 is connected to the normally open contact 108 of a cycle relay 110 through a single-turn primary winding 112 on a small core 114. A single-turn sense winding 116 is threaded through the core 114 without regard as to the mutual polarity between the primary winding 112 and the sense winding 116. The sense winding 116 is connected to the a current pulse circuit 118 by electrical leads 120 and 122.

As shown in FIG. 4, an alternating source of power, such as 120 VAC, 60 Hertz, is provided having a hot side L1, and a neutral side N.

As shown in FIG. 4, the motor control 124 is provided with power from the AC source via a voltage regulator circuit 126 by electrical leads 128 and 130. The voltage regulator circuit 126 is used to generate a regulated source of DC voltage V+ on electrical line 131 appropriate for the microcomputer 134 and other electronics. The voltage regulator circuit 126 also provides a full-wave rectified signal voltage 136 to the volt pulse circuit 138 and a filtered, but unregulated DC bias voltage 132 to the current pulse circuit 118. The volt pulse circuit 138 provides a binary volt pulse signal 140 to the microcomputer 134. The current pulse circuit 118 provides a binary current pulse signal 135 to the microcomputer 134.

A watchdog circuit 142 provides a binary RESET signal 148 to the microcomputer 134. The microcomputer 134 provides a binary status signal 144 and a binary volt pulse echo signal 146 to the watchdog circuit 142.

Binary output lines 150 form the microcomputer 134 may be provided for various console indicators such as a full trash bag 152 or no-compaction 154 light emitting diode. Additional binary inputs lines 156 to the microcomputer 134 are also provided. A top limit switch 158 provides a HIGH input to the microcomputer when the ram assembly 32 is in the home position, and, a LOW input to the microcomputer when the ram assembly is in any other position. A drawer switch 160 provides a HIGH input to the microcomputer 134 when the drawer is open, and, a LOW input to the microcomputer 134 when the drawer is in the closed position appropriate for a compaction cycle. The tilt switch provides a HIGH input to the microcomputer 134 when the load encountered by the ram assembly 32 is sufficiently skewed as to warrant termination of the present compaction cycle, and, a LOW input at all other times. The low compaction force cycle selection input 164 is LOW when a LOW-MEDIUM-HIGH cycle selection switch is in the low force cycle position, and, HIGH when in the medium or high cycle positions. The medium compaction force cycle selection input 166 is LOW when the LOW-MEDIUM-HIGH cycle selection switch is in the medium force cycle position, and, HIGH when in the low or high cycle positions. The user's desire for a high compaction force cycle is inferred when low 164 and medium 166 binary inputs are both HIGH.

The start button input 168 to the microcomputer 40 is used to initiate a cycle, terminate a cycle, or, invoke the solid pack cycle pending on when the start button is pressed. The start button input 168 is LOW when the user is pressing the start button, and, HIGH at all other times. It will be apparent to those skilled in the art that an external crystal or ceramic resonator circuit, not illustrated, is used in conjunction with the microcomputer 134 in accordance, with manufacturer specification, to define the internal clock cycles and timing functions. In the exemplary embodiment the microcomputer 145 is a Texas Instruments TMS7040 which has an 8-bit word size and the external crystal is a five megahertz ceramic resonator.

One binary output 170 of the microcomputer 132 is used to control a first TRIAC driver circuit 172.

The first auxiliary winding 104a of the motor 100 is connected to the second main terminal MT2 of TRIAC 172. The first main terminal MT1 of TRIAC 172 is connected to the normally open contact 108 of the cycle relay 110. The cycle relay 110 connects the motor main winding 102 and the auxiliary winding TRIAC 174 to the hot L1 side of the service voltage whenever the motor 100 in ON. Conversely, the cycle relay 110 disconnects the motor main winding 102 and the TRIAC 174 from the service voltage between cycles and when the motor 100 is OFF during a cycle, say, during a pause period when the ram assembly 32 at the bottom of a stroke. A common electrical lead 175 completes a circuit path for the motor main winding 102 and auxiliary winding 104a to the neutral side N of the AC power source through the overload protector 106.

Similarly, a binary output 176 of the micro computer 132 is used to control a second TRIAC driver circuit 178. The second auxiliary winding 104b of the motor 100 is connected to the second main terminal MT2 of TRIAC 180 controlled by circuit 178. The first main terminal MT1 of TRIAC 180 is connected to the normally open contact 108 of the cycle relay 110. The cycle relay 110 connects the motor main winding 102 and the auxiliary winding TRIAC 180 to the hot L1 side of the service voltage whenever the motor 100 is ON and disconnects the motor main winding 102 and the TRIAC 180 from the service voltage between cycles and when the motor 100 is OFF. The common electrical lead 175 also completes a circuit path for the auxiliary winding 104b to the neutral side N of the AC power source through the overload protector 106.

The binary outputs 170 and 176 of the microcomputer 134 are used to control the TRIAC driver circuits 172 and 178 to provide control signals which are applied to the gates G1 and G2 of TRIACs 174 and 180, respectively. Each TRIAC driver circuit 172 and 178 is also connected to main terminal MT1 or MT2 of a TRIAC 174 or 180.

Another binary output 182 of microcomputer 134 is connected to a relay driver circuit 184. Driver circuit 184 is used to control the coil 186 of the cycle relay 110.

The individual circuits of the motor control 124 that are shown in block diagram form in FIG. 4 are illustrated in greater detail in FIGS. 5 through 10.

Figure 5:
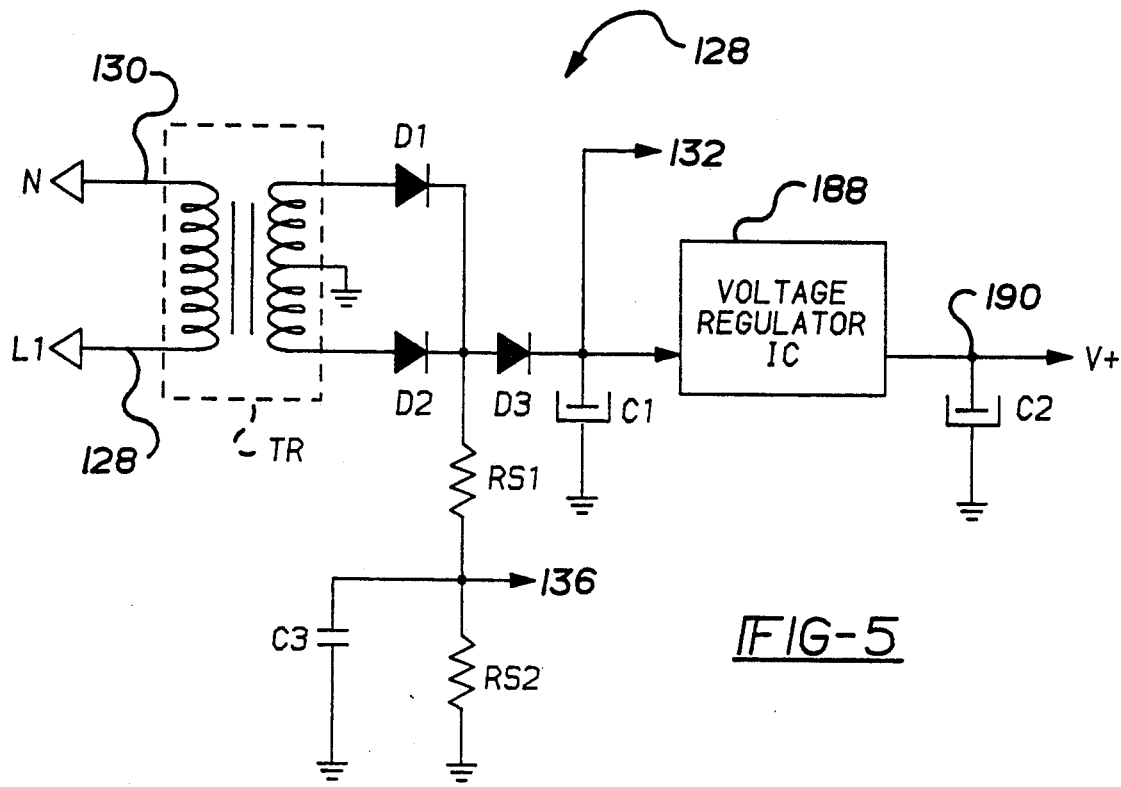
FIG. 5 is a circuit diagram for the voltage regulator circuit of FIG. 4.

FIG. 5 is a circuit diagram for the voltage regulator circuit 128 of FIG. 4. The voltage regulator circuit 124 uses the service alternating voltage as an input and generates a regulated DC voltage for all electronic circuits, a full-wave rectified signal voltage for the volt pulse circuit of FIG. 3 and an unregulated, DC bias voltage for the current pulse circuit of FIG. 4.

A centertapped step down transformer is used with diodes D1 and D2 to develop a 120 Hz, full-wave rectified voltage waveform. Capacitor C1 is a pre-filter and capacitor C2 is a post-filter for the voltage regulator integrated circuit 188. Diode D3 isolates the pre-filtered DC voltage at the input to the voltage regulator 188 form the full-wave rectified signal at the cathodes of D1 and D2. Resistors RS1 and RS2 form a voltage divider circuit and provide a sufficient load to forward bias diodes D1 or D2. High frequency noise transduced from the primary to the secondary of transformer TR is filtered by bypass capacitor C3. There are three outputs from the voltage regulator circuit 128. The V+ output 131 is a regulated DC voltage for the microcomputer 134 and other electronic circuits. A filtered, but unregulated DC voltage 132 is available to bias the sensitivity of the current pulse circuit 118 for the effect of variation in service voltage on the magnitude of the ferrite core sensor 114 signal. And, a full-wave rectified signal voltage 136 is developed for the volt pulse circuit 138. In the exemplary embodiment V+ is five volts.

Figure 6:
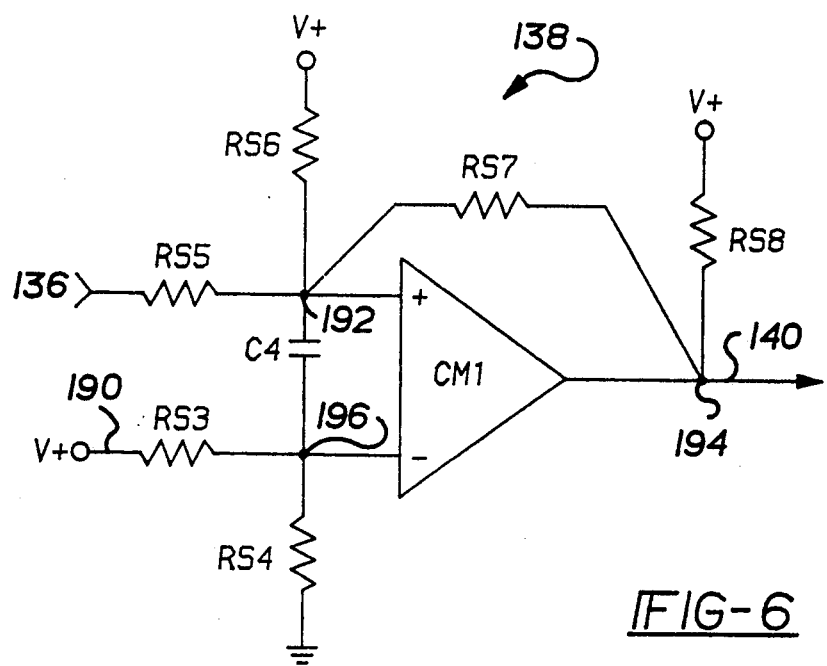
FIG. 6 is a circuit diagram for the volt pulse circuit of FIG. 4.

FIG. 6 is a circuit diagram for the volt pulse circuit 138 of FIG. 4. The volt pulse circuit receives a full-wave voltage signal input from the voltage regulator circuit of FIG. 5 and generates a volt pulse train wherein each binary volt pulse straddles the service voltage zero-crossings. The volt pulses occur at twice line frequency, regardless of whether the motor is ON, and, have a pulse width inversely related to the service voltage.

The volt pulse circuit 138 comprises resistors RS3, RS4, RS5, RS6, RS7 and RS8, a capacitor C4 and a comparator CM1 which is supplied with V+ from the voltage regulator circuit 128. Resistor divider RS3 and RS4 is used to define a DC voltage threshold 196 at the inverting input of comparator CM1. The 120 Hz, full-wave signal 136 from the voltage regulator circuit 128 is applied to the non-inverting input 192 of comparator CM1 through the resistor divider RS5 and RS6. Resistor RS7 is connected from the output 194 to the non-inverting input 192 of comparator CM1 to provide hysteresis and thereby stabilize transitions of the volt pulse signal 140. A pull-up resistor RS8 is connected to V+ from the output 194 of comparator CM1. Capacitor C4 filters any remaining high frequency noise across the inputs of comparator CM1.

Figure 11A:
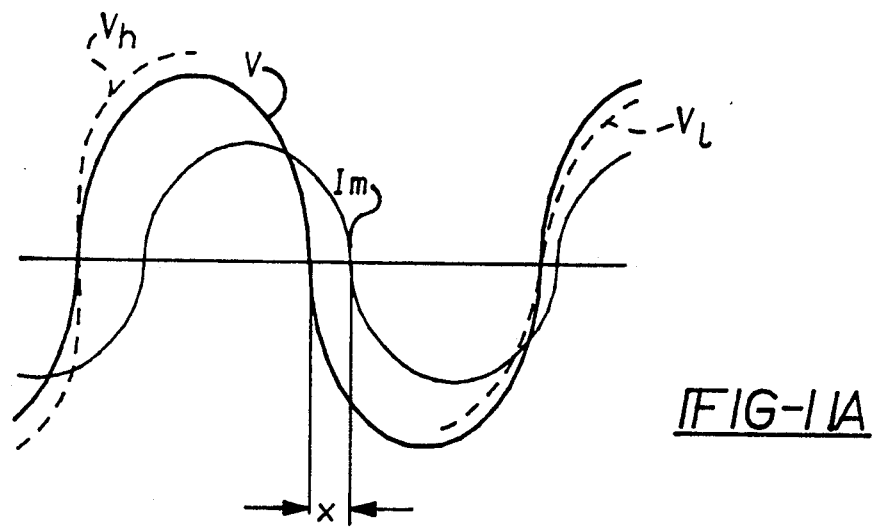
FIGS. 11a, 11b, 11c, 11d and 11e are graphic representations of various waveforms and pulses which are present in the circuits shown in FIGS. 4, 5, 6 and 7.
Figure 11B:
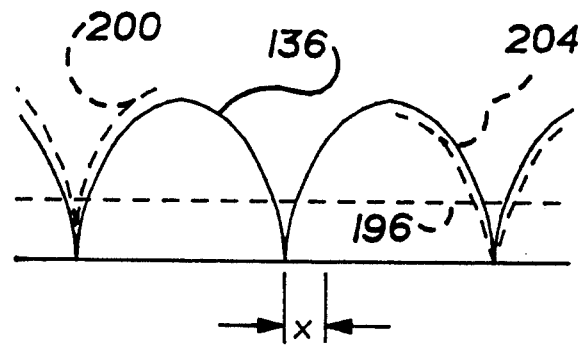
Figure 11C:
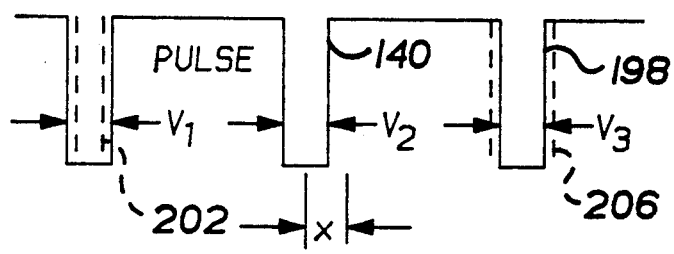

FIG. 11a graphically illustrates the alternating service voltage V and the main winding current Im of the motor 100. The full-wave signal 136 and DC voltage threshold 196 is shown graphically in FIG. 11b. The volt pulse train 140 at the output of comparator CM1 is shown graphically in FIG. 1c. The volt pulses occur at two-times the line voltage frequency regardless of whether the motor 100 is ON or OFF. For a 60 Hz source, there are 120 volt pulses per second. As shown in FIG. 11a, 11b and 11c, the width of each volt pulse may vary according to the amplitude of the line voltage and hence, the full-wave rectified waveform 136, which determines the steepness or slope of the waveform in the vicinity of the zero value. If the line voltage V of FIG. 11a and hence, the full-wave waveform 136 of FIG. 11b is assumed to be an average or mean waveform which produces the pulses shown in the solid line 198, a line voltage waveform Vh as shown in FIG. 11a having a larger than average amplitude will produce a full-wave waveform 200 with a larger than average amplitude and will generate a narrower pulse 202, as shown in broken lines in FIG. 11c. And, similarly, a line voltage waveform V1 having a small than average amplitude will produce a full-wave waveform 204 having a smaller amplitude than the waveform 136 and will produce a wider pulse 206, also shown in broken lines in FIG. 11c. Three successive voltage pulses V1, V2 and V3 are shown in FIG. 11c in relation to the full-wave rectified waveform 136. A continuous series of these volt pulses is supplied to the microcomputer 134 whenever the refuse compactor 10 is connected to the service voltage.

Referring again to FIG. 4, in accordance with Faraday's law of voltage induction, the electromotive force, or voltage, induced across the sense winding 116 is proportional to the rate of change of the magnetic flux of core 114. However, the core 114 quickly saturates immediately following each current zero-crossing of the main winding current in wire 112. Thus, a sharp voltage spike is generated across terminals 120 and 122 of the sense winding 116 whenever the current passing through the motor main winding 102 reverses polarity, or, passes through a zero-crossing. The core 114 generates a train of alternating positive and negative voltage spikes at pulse rate of two-times line frequency. The magnitude and sharpness of each spike is proportional to the rate of change of the current flowing through the primary winding 102 at the zero-crossing. However, it is the timing relationships between the line voltage and motor main winding 102 current zero-crossings which is of interest in the present invention, not the magnitude of the current in the main winding 102, or, the magnitude of the induced voltage spikes.

Figure 11D:
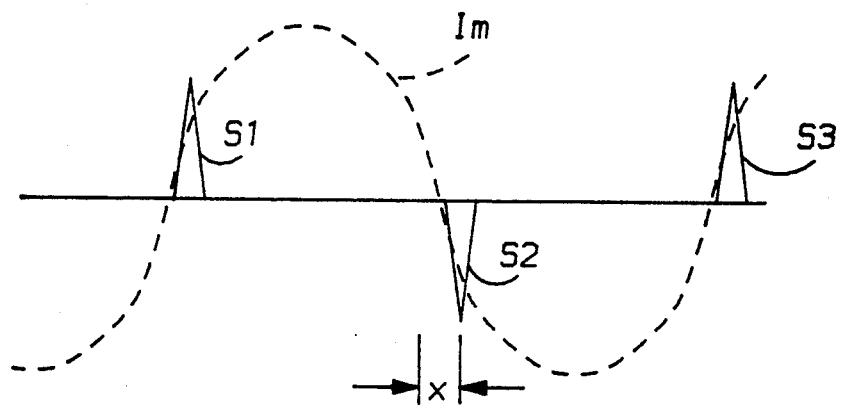

The induced voltage spikes for the first three zero-crossings of the current in the main winding 102 are shown in FIG. 11d as voltage spikes S1, S2 and S3. The current is also shown as a dashed line in FIG. 11d. The preferred part for ferrite core 114 in this embodiment is Fair-Rite 43 Shiled Bead #2643000801 manufactured by the Fair-Rite Products Corporation in Wallkill, N.Y. The smaller the inside diameter of the core, and, the longer the length dimension of core 114 parallel to the primary winding 112, the larger the magnitude of the induced voltage across the sense winding 116. The peak magnitude of the induced voltage spikes S1, S2 and S3 in FIG. 11d is 40 millivolts. The core 114 is preferably located on a printed circuit board near the current pulse circuit 118 and other electronics to avoid the use of connectors with the small sense 116 voltage. However, the core 114 may be alternatively located remote from the electronics, say, on or near the motor 100.

Figure 7:
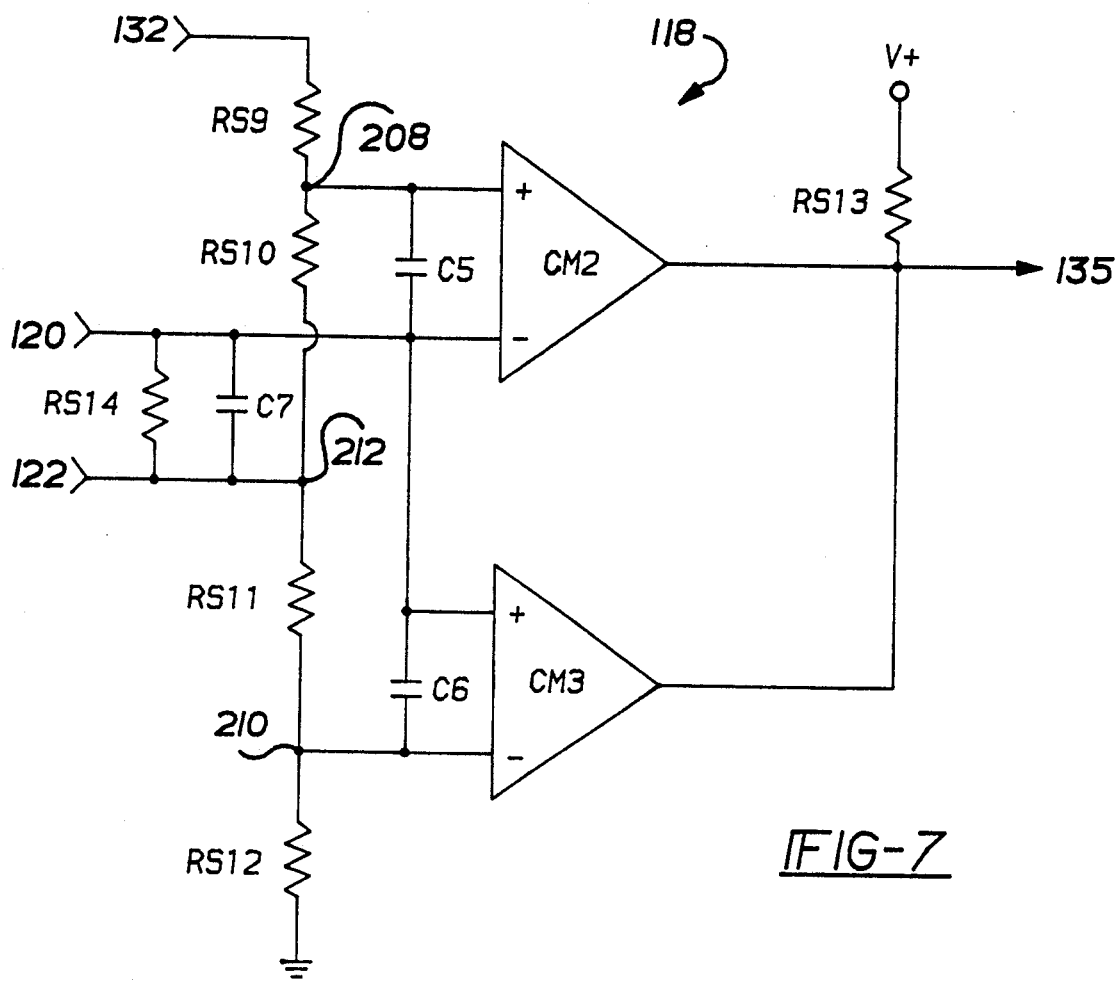
FIG. 7 is a circuit diagram for the current pulse circuit of FIG. 4.

FIG. 7 is a circuit diagram for the curent pulse circuit 118 of FIG. 4. The current pulse circuit receives the ferrite core sense winding voltage signal as an input and provides a brief, current pulse output in response to the current zero-crossings of the motor main winding current. The curent pulses occur at twice the service frequency, or, 120 pulses per second for a service frequency of 60 Hz. The unregulated, DC bias voltage from the voltage regulator circuit of FIG. 5 adjusts the sensitivity of the combined sensor and current pulse circuitry for the effect of service voltage variation on the motor main winding current.

The current pulse circuit 118 uses two voltage comparators CM2 and CM3 to convert the induced voltage spikes S from the ferrite core sensor 114 to a binary current pulse output signal 135. Comparator CM2 responds to the positive induced voltage spikes S and comparator CM3 responds to the negative induced voltage spikes. The outputs of comparators CM2 and CM3 form a logical "wired OR" connection such that either comparable is capable of pulling the output 135 to the circuit ground, or logical zero state. More specifically, the output of both comparators CM2 and CM3 is connected to V+ by the pull-up resistor RS13.

The unregulated DC bias voltage 132 fro the voltage regulator circuit 126 is applied across the series resistor divider network comprising resistors RS9, RS10, RS11 and RS12. This has the effect of increasing the sensitivity of both comparators CM2 and CM3 when the line voltage is low and rate of change of the current in the main winding 102 in the vicinity of a current zero-crossing is also low. The preferred circuit thereby compensates the sensitivity of the ferrite core 114 and the current pulse circuit 118 for the effect of service voltage variation on the main winding current. However, resistor RS9 may also be connecetd to V+ if such compensation is not desired.

The common connection 208 between resistors RS9 and RS10 is connected to the non-inventing input of comparator CM2. The common connection 210 between resistors RS11 and RS12 is connected to the inverting input of comparator CM3. The common connection 212 between resistors RS10 and RS11 is connected to one end 122 of the ferrite core 114 sense winding 116. The other end 120 of the sense winding 116 is connected to inverting input of comparator CM2 and the non-inventing input of comparator CM3. Capacitor C7 is wired in parallel with the ferrite core 114 signal 120 and 122 and is used to filter high frequency noise on the ferrite core 114 signal voltage. Much of the high frequency noise originates from service lines L1 and N and is coupled in a capacitive manner from the primary winding 112 to the sense winding 116 of ferrite core 114.

The use of single-turn windings 112 and 116 on ferrite core 114 minimizes such capacitive coupled noise. A further reduction, or elimination, of this noise could be achieved through the use of a nickel tape-wound core rather than a ferrite core 114 because a nickel tape-wound core has a natural high frequency cutoff. However, the preferred circuit uses a ferrite core 114 for cost considerations.

Resistor RS14 is wired in parallel with the ferrite core signal 120 and 122 to provide a continuity path which forces the output 135 of the current pulse circuit 118 HIGH in the unlikely event that the sense winding 116 becomes open-circuited, or, that terminals 120 or 122 become disconnected. The control interprets missing current pulses 135 the same as an OPEN motor thermal protector 106. Hense, a cycle will be aborted in the event that the sensor circuit becomes OPEN. Capacitors C5 and C6 filter any remaining high frequency noise across the inputs of comparators CM2 and CM3, respectively.

When the voltage across inputs 120 and 122 is zero, resistors RS10 and RS11 bias comparators CM2 and CM3, respectively, such that both outputs are HIGH and the current pulse is absent. When a positive induced voltage spike S occurs, such that terminal 120 is temporarily positive with respect to terminal 122, the input voltage exceeds the DC bias voltage across resistor RS10 of comparator CM2 and comparator CM2 pulls the output 135 of the current pulse circuit 118 LOW. Similarly, when a negative induced voltage spike S occurs, such that terminal 120 is temporarily negative with respect to terminal 122, the input voltage exceeds the DC bias voltage across resistor RS11 of comparator CM3 and comparator CM3 pulls the output 135 of the current pulse circuit 118 LOW. Thus, the current pulse circuit 118 responds to either positive or negative induced voltage spikes from the ferrite core sensor 114. The output 135 of the current pulse circuit 118 is supplied to the microcomputer 134 as an interrupt to read the present value of the microcomputer timer on the leading edge of a current pulse.

Figure 11E:
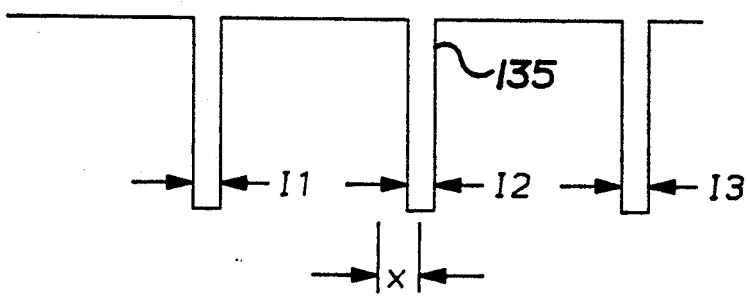

A pulse train of induced ferrite core voltage spikes S1, S2 and S3 and corresponding current pulses I1, I2 and I3 are shown graphically in FIG. 11d and 11e, respectively. It will be apparent to those skilled in the art that a systematic bias could be introduced in the motor phase data from odd or even numbered line half cycles due to component differences between RS10 and RS11, or, between comparators CM2 and CM3. Similarly, a systematic bias could be introduced in the motor phase data due to occasional asymmetry in the positive and negative half cycles of the service voltage, say, due to a silicon controlled rectifier load, from another appliance, which draws power unevenly from alternate line half cycles. Rather than ignoring this potential bias, or, employing costly component matching techniques, the preferred embodiment eliminates the effect of the above systematic biases through the exclusive use of microcomputer 134 software programs which either use sufficient data memory to make motor phase comparisons without mixing data from odd and even numbered line half cycles, or, make decisions from data which include an equal number of motor phase samples from positive and negative line voltage half cycles.

Figure 8:
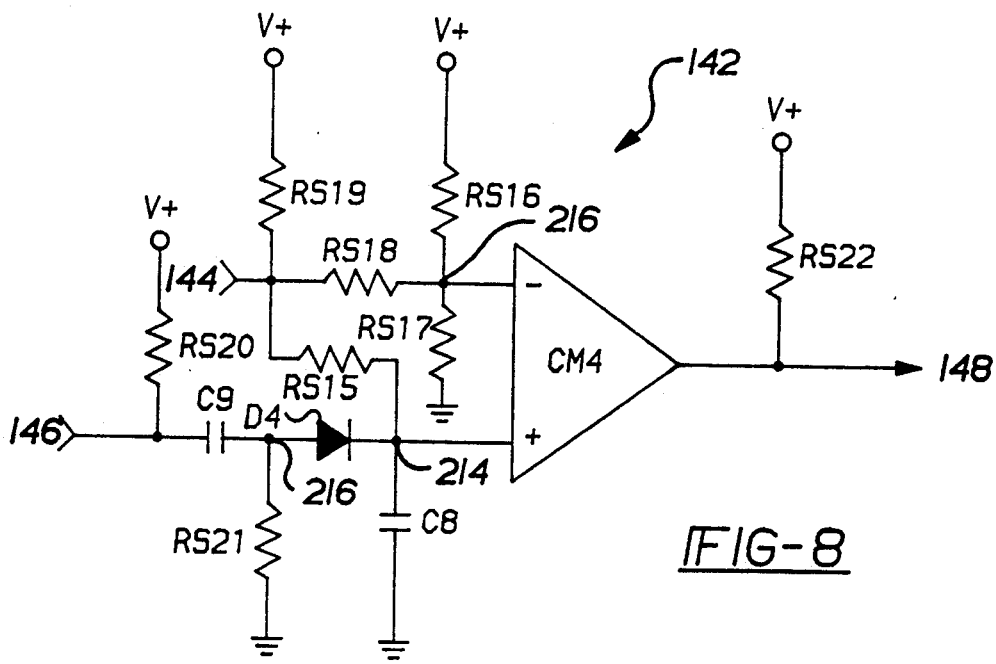
FIG. 8 is a circuit diagram for the watchdog circuit of FIG. 4.

FIG. 8 is a circuit diagram for the watchdog circuit 142 of FIG. 4. The watchdog circuit 142 provides a hard-wired RESET signal to the microcomputer 134 whenever the microcomputer fails to echo the volt pulse signal 140 to the watchdog circuit 142 for a preset period of time. The watchdog circuit 142 also resets the microcomputer 134 during the initial powerup period.

More specifically, input 144 to the watchdog circuit 142 is a dedicted status output from the microcomputer 134 which is HIGH whenever the microcomputer is being RESET and LOW at all other times via microcomputer software. All microcomputer outputs including output line 144 are HIGH whenever the microcomputer 134 is RESET. Resistor RS22 is a pullup resistor at the output of comparator CM4 for the RESET signal 148 to the microcomputer. The microcomptuer 134 is being RESET when the comparator CM4 output 148 is LOW. Resistor RS19 is a pull-up resistor for the status input 144. When the microcomputer 134 is being RESET, the status input 144 is HIGH and capacitor C8 charges toward V+ through resistors RS15 and RS19. At all other times the status input 144 is LOW and capacitor C8 is discharging toward circuit ground through RS15. The common connection 214 between resistor RS15 and capacitor C8 is wired to the non-inventing input of comparator CM4 and the cathode of diode D4. The resistor divider RS16 and RS17 defines a DC voltage threshold at the inverting input 216 of comaprator CM4. Resistor RS18 is connected from the status input 144 to the inverting input 215 of comparator CM4. Resistor RS18 provides a feedback which ensures overall circuit 142 stability when the RESET signal 148 is removed and the microcomputer status input goes from HIGH to LOW. Capacitor C9 is connected from the volt pulse echo input 146 to the anode of diode D4. Resistor RS20 is a pullup resistor for the microcomputer 134 volt pulse echo output 146. A current path from the connection 218 between capacitor C9 and diode D4 to circuit ground is provided by resistor RS21.

Under normal operating conditions a volt pulse train 140 comprising 120 volt pulses per second is received by the microcomptuer 134 and microcomputer sofware is used to echo the volt pulse 140 to the watchdog circuit 142 via watchdog circuit input 146. Energy from the positive voltage transistion at the trailing edge of each volt pulse echo signal is coupled by capacitor C9 and diode D4 to charge capacitor C8. Should the volt pulse echo signal remain either in the HIGH or the LOW state, capacitor C8 will discharge through resistor RS15 toward circuit ground. When the voltage at the non-inventing input 214 of comparator CM4 drops below the DC threshold voltage at the inverting input 216, the comparator CM4 output will switch from HIGH to LOW and a RESET signal 148 will be sent to the microcomputer. If the refuse compactor 10 happens to be in a compaction cycle, the cycle will be aborted.

Upon recognizing receipt of a RESET signal, all microcomputer output lines, including the watchdog status input 144, will go HIGH, and, capacitor C8 wil charge toward V+ through resistors RS15 and RS19. Feedback resistor RS18 will provide a somewhat higher DC threshold at the inverting input 75 of comparator CM4. When the capacitor C8 has charged sufficiently to cause the voltage at the non-inventing input 214 of comparator CM4 to exceed the DC threshold at the inverting input 216, the comparator CM4 output will go LOW, the microcomputer status input 144 to the watchdog circuit 142 will go LOW via microcomputer software, and, microcomputer will be restored to normal operation.

A refuse compaction cycle will begin the next time that the user presses a start button 168. On initial powerup the status input 144 is HIGH and the comparator CM4 output 148 remains LOW until the capacitor C8 has charged sufficiently to cause the voltage at the non-inventing input 214 to comparator CM4 to exceed the DC threshold at the inverting input 216. Hence, the microcomputer 134 will be RESET on powerup.

Figure 9:
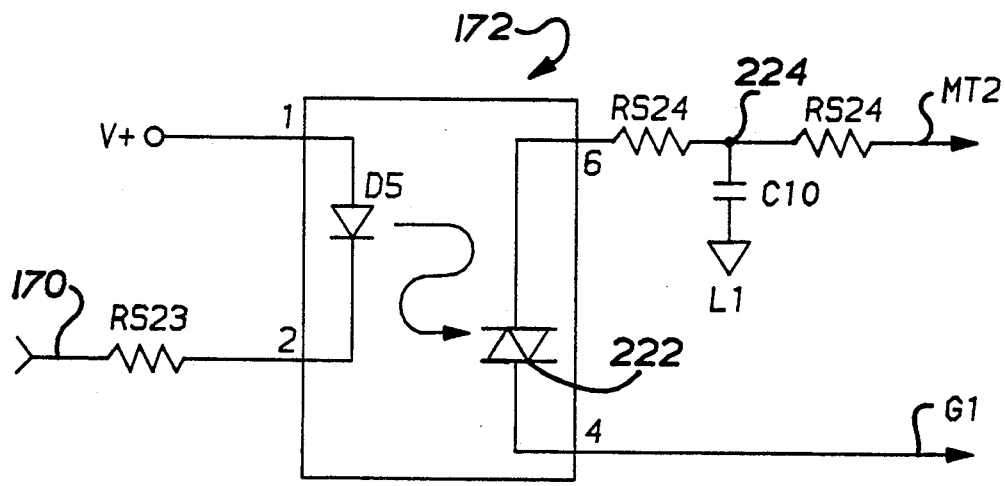
FIG. 9 is a circuit diagram for the TRAIC driver circuit of FIG. 4.

FIG. 9 is a circuit diagram for the TRIAC driver circuit 172 of FIG. 4. The TRIAC driver circuit 172 uses an opto-TRIAC integrated circuit to drive a large, AC motor TRIAC fro a small binary microcomputer output signal while maintaining electrical isolation of the microcomputer circuitry from the service voltage.

More specifically, the preferred circuit uses a MCP 3011 optically isolated TRIAC driver IC which contains a light emitting diode D5 and a small photo-TRIAC 222. The anode of the light emitting diode D5 is connected to V+ and the cathode of D5 is connected to resistor RS23 which is driven by a binary output from microcomputer 134. The photoTRIAC 222 is connected from the gate of the motor TRIAC 174, and, to the second main terminal MT2 of the same motor TRIAC 174 via resistors RS24 and RS25. Capacitor C10 is wired from the common connection 224 of resistors RS24 and RS25 to the hot L1 side of the service voltage. Capacitor C10 provides a snubbing circuit for both the photoTRIAC 222 and the motor TRIAC 174 via resistors RS24 and RS25, respectively. The snubbing circuit limits the rate of change of voltage across both the photoTRIAC 222 and the motor TRIAC 174 and thereby avoids spurious activation of the either TRIAC in the absence of light energy from the diode D5. More, specifically, when the binary output from the microcomputer 134 is HIGH, the diode D5 is not forward biased, no light energy passes to the photoTRIAC 222, the photoTRIAC is OFF or blocking state and the motor TRIAC 174 is not triggered. When the microcomputer 134 binary output is LOW, diode D5 is foward biased, light energy passes from the light emitting diode D5 to the photoTRIAC 222, the photoTRIAC is triggered ON, a circuit is completed from the second main terminal MT2 to the gate of the motor TRIAC 174 via resistors RS24 and RS25, and, the motor TRIAC is triggered. TRIAC driver circuit 178 is identical to circuit 172 and is therefore, not shown, in the drawing.

Figure 10:
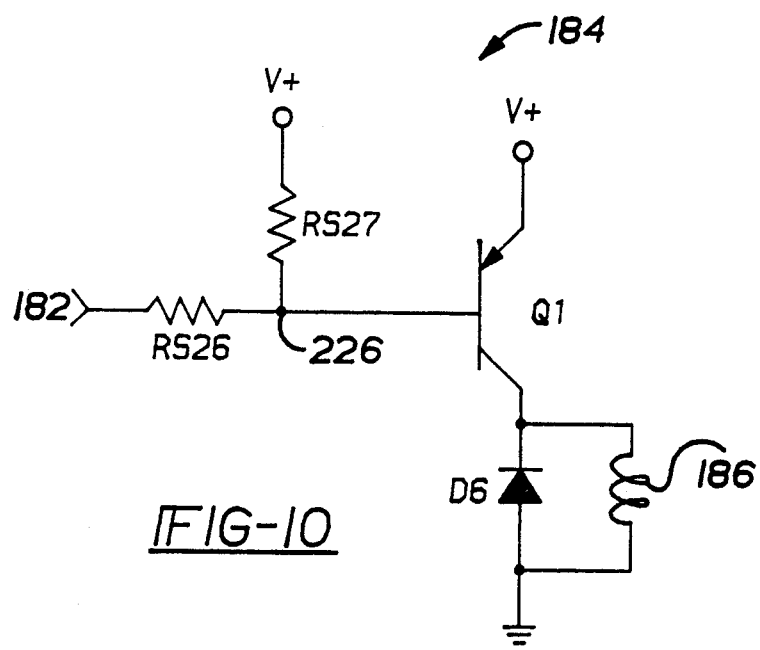
FIG. 10 is a circuit diagram for the relay driver circuit of FIG. 4.

FIG. 10 is a circuit diagram for the relay driver circuit 184 of FIG. 4. The relay driver circuit 184 uses a PNP transistor to drive a DC relay coil from a small binary microcomputer output signal. The relay coil is electrically isolated from the service voltage.

The preferred circuit uses a PNP transistor Q1 inverter to provide sufficient current gain to drive a DC relay coil from the binary microcomputer 134 output signal 182. More specifically, resistor RS27 is connected from the base of PNP transistor Q1 to V+ and resistor RS26 is connected from the binary microcomputer 134 output 182 to the base of transistor Q1. The emitter of PNP transistor Q1 is directly connected to V+. The collector of transistor Q1 is connected from one end of the DC relay coil 186 and the cathode of diode D6. The anode of diode D6 is connected to circuit ground and the the end of the DC relay coil. Diode D6 is flyback diode which dissipates the stored magnetic field of the relay coil when the PNP transistor Q1 turns OFF. When the binary microcomputer 134 output line 182 is LOW, sufficient base drive current is provided through resistor RS26 to forward bias transistor Q1, energize the relay coil 186 and close the cycle relay contact 110. When the binary microcomputer output line 182 is HIGH, transistor Q1 is in the OFF, or blocking, state, the relay coil is not energized and the cycle relay 110 is open.

Although the values of the components shown in FIG. 5 through 19 may be selected to meet individual circuit requirements in a manner known to those skilled in the art without departing from the inventive concept disclosed herein, an exemplary embodiment of these circuits can be realized wherein the comparators CM1, CM2, CM3 and CM4 are each one-quarter of an LM339 quadruple comparator package, the voltage regulator integrated circuit 128 is to a 7805 five volt regulator IC, the TRIAC driver circuits 172 and 178 use MCO3011 optically isoalted TRIAC driver integrated circuits and wherein the remaining components have the following values:

| COMPONENT | VALUE (OHMS/MICROFARADS) |
|---|---|
| RS1 | 1.2K |
| RS2 | 1K |
| RS3 | 100K |
| RS4 | 24K |
| RS5 | 10K |
| RS6 | 100K |
| RS7 | 680K |
| RS8 | 5.6K |
| RS9 | 10K |
| RS10 | 22 |
| RS11 | 22 |
| RS13 | 5.6K |
| RS14 | 100 |
| RS15 | 100K |
| RS16 | 3.9K |
| RS17 | 1K |
| RS18 | 10K |
| RS19 | 6.8K |
| RS20 | 3.3K |
| RS21 | 1.5K |
| RS22 | 5.6K |
| RS23 | 330 |
| RS24 | 180 |
| RS25 | 100 |
| RS26 | 1.5k |
| RS27 | 10k |
| C1 | 1500 |
| C2 | 33 |

| COMPONENT | VALUE (OHMS/MICROFARADS) |
|---|---|
| C3 | 0.02 |
| C4 | 0.0047 |
| C5 | 0.01 |
| C6 | 0.01 |
| C7 | 0.68 |
| C8 | 0.47 |
| C9 | 0.15 |
| C10 | 0.02 |

Flow charts for a programmed microcomputer are illustrated in FIGS. 12 through 23 which show how the microcomputer 134 may be dedicated during one portion of each line half cycle to monitor timing relationships between the volt and current pulses with crystal controlled clock cycles. Through the speed of the microcomputer, all data processing and/or decision making is completed before the arrival any volt or current pulse information for the next line half cycle. The flow charts also show how the microcomputer 134 processes the motor phase information to detect when the motor 100 has started; establish various average motor torque baselines; monitor motor torque dither, or, the absence of dither; and, detect when the average motor torque has surpassed, or deviated from, an established baseline. Further additional supervisory flow charts for the programmed microcomputer 134 are disclosed which show how these computed parameters may be utilized to automatically control the cycle of a refuse compactor 10 with a split phase induction motor 100.

Figure 12:
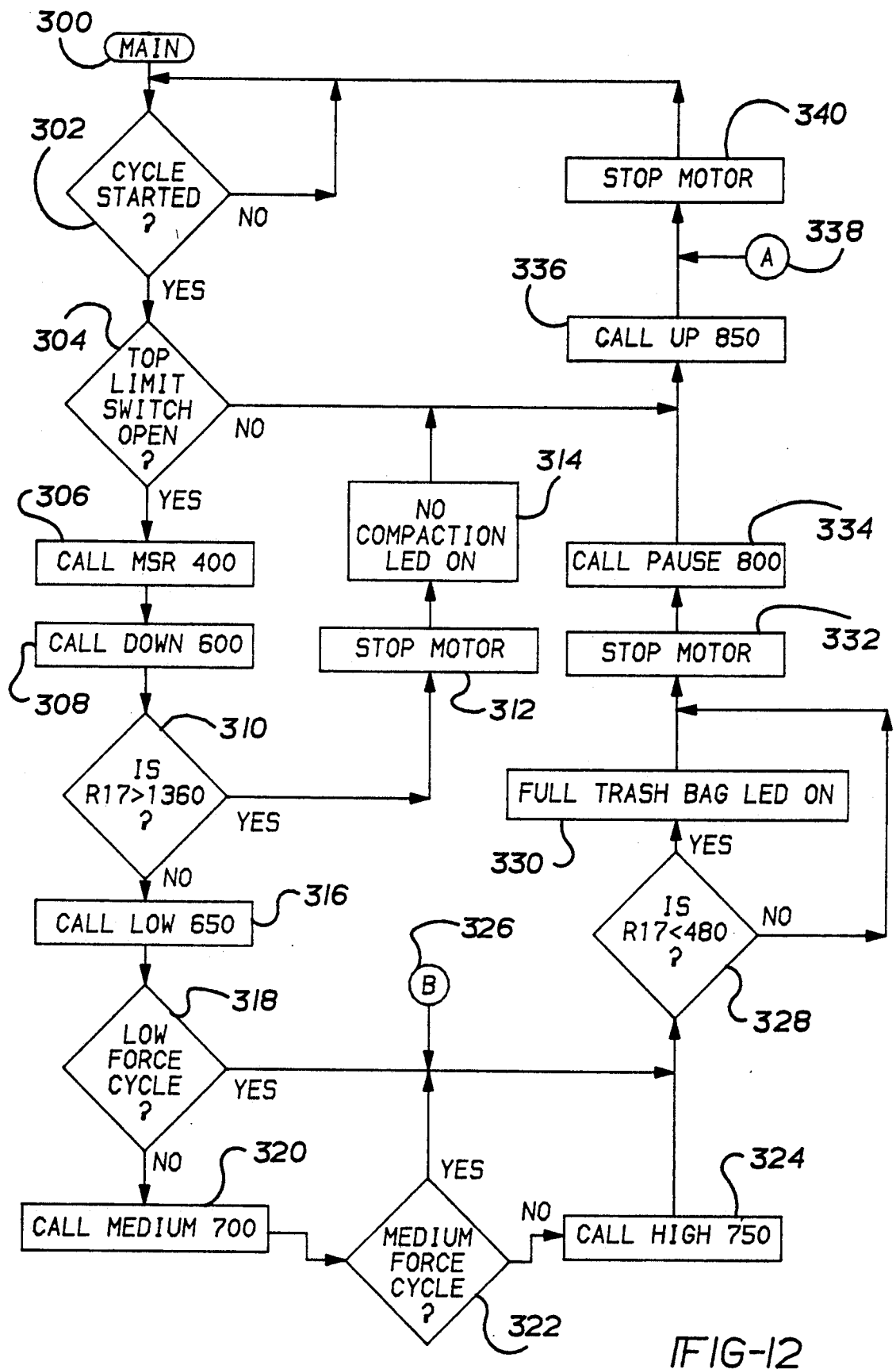
FIG. 12 is a flow chart for the MAIN program of the microprocessor of FIG. 4 for controlling a domestic refuse compactor cycle which directly or indirectly calls the various sub-routines of FIGS. 13 through 23 to control the refuse compactor of FIGS. 1 and 2 according to the present invention.

FIG. 12 is a flow chart for the MAIN program 300 for a domestic refuse compactor cycle. The MAIN program 300 calls the motor start routine MSR 400, the DOWN routine 600, the LOW routine 650 and the UP routine 850. The MAIN program 300 provides a complete refuse compaction cycle.

More specifically, the MAIN program 300 loops continuously through program decision step 302 until the user presses the start button to initiate a cycle. When a cycle has been initiated, the program falls through decision step 303 to decision step 304. Decision step 304 checks the status of the top limit switch and branches directly to program step 336 if the ram assembly 23 is not in the home position from the most previous cycle. Program steps 336 and 34 then return the ram assembly 32 to the home position in a manner which will be described later. Otherwise, the ram assembly is in the home position, as is normally the case, and the program falls through decision step 304 to program step 306 to begin a normal refuse compaction cycle. Program step 306 calls the motor start routine MSR 400 as a subroutine to start the motor with the ram assembly moving in the down direction to begin a refuse compaction stroke. Program step 306 returns to the MAIN program 300 with the ram assembly 320 moving in the down direction and the motor substantially lightly loaded because actual refuse compaction will not begin until the ram assembly has reached an area of travel on the power screws 44a and 44b where it actually begins to compact refuse.

The down routine 600 is called by the MAIN program 300 at step 308. The DOWN routine 600 uses a programmed referencing procedure to sample the unloaded motor 100 torque while the ram assembly is traveling in a free, unhindered manner; computes a motor 100 torque threshold once per each revolution of the power screws 44a and 44b; and, returns to the MAIN program 300 as soon as the motor torque has shown an increase from the baseline level. The fact that the motor torque has increased from the baseline torque level means that either the ram assembly has begun to compact refuse, or, the ram assembly has bottomed out against the internal structure of the comapctor 10. Decision step 310 discriminates between ram bottoming and actual refuse compaction by comparing the elapsed time since the ram has cleared the top limit switch in data memory register R17 to a preset time threshold. If the elapsed cycle time in line half cycles has exceded 1360 half cycles, or, at 120 half cycles per second, 11.3 seconds, the program branches to step 312 wherein the compaction cycle is aborted regardless of the user cycle selection.

Program step 312 deactivates the cycle relay 110 by driving microcomupter 134 output line 182 HIGH. Program step 314 activates the "no compaction" console LED by driving microcomputer output line 154 LOW. The program then falls into steps 336 and 340 which return the ram assembly to the home position without providing a controlled pause period, and, without providing an opportunity for the user to invoke the "solid pack" cycle. Otherwise, the program falls through decision step 310 to program step 316 which calls the LOW routine 650. The LOW routine 650 is called with the ram beginning to compact refuse and the motor 100 experiencing a generally increasing load torque. The main winding 102 phase numbers are generally decreasing as the motor torque increases. The LOW routine 650 returns to the MAIN program 300 when the sum of the last two consecutive main winding phase numbers has dropped below a threshold defined previously in the same cycle as part of the motor start procedure via the motor start routine MSR 400. Decision step 318 advances the cycle to decision setp 328 if the user has selected the low compaction force cycle; otherwise, the program falls through to step 320 with the compaction forces building and rapidly approaching the motor breakdown torque.

Program step 320 calls the MEDIUM routine 700. The MEDIUM routine 700 keeps track of the minimum sum of two consecutive main winding 102 phase numbers. The MEDIUM routine 700 returns to the MAIN program 300 when the sum of the last two main winding phase numbers has exceeded the previous minimum sum of two main winding phase numbers for three consecutive line half cycles. In other words, the MEDIUM routine 700 returns to the MAIN program 300 as soon as the main winding motor phase data has indicated that the refuse compaction load torque has exceeded the available motor 100 breakdown torque. Decision step 322 causes the program to branch to decision step 328 if the user has selected the medium force refuse compaction cycle; otherwise, the user has selected the high compaction force cycle and the program falls through to step 324. The HIGH routine 750 is called at program step 324. The HIGH routine 750 achieves additional compaction force in excess of the normal motor 100 main winding 102 breakdown torque by reactivating the down auxiliary winding 104a via motor TRIAC 174. The HIGH routine 750 returns to the MAIN program 300 at decision sep 328 as soon as the sum of the last two main winding phase numbers exceeds a threshold defined by the motor start routine MSR 400 earlier in the same cycle. In other words, the HIGH routine 750 returns to the MAIN program 300 after extracting all of the available torque from the motor 100 with both the main winding 102 and the down start winding 104 energized simultaneously; but before the motor 100 has had time to stall or overheat. Decision step 328 interrogates the elapsed time register R17 to determine whether or not the trash bag is full. In other words, if the compaction portion of the stroke has been completed before the ram assembly 32 has had sufficient time to travel beyond a preset point, it may be assumed that the trash bag is full. Specifically, if the elapsed cycle time in register R17 is less than 480, or four seconds the full trash bag console LED 152 is illuminated in step 330 by driving microcomputer 134 output line 152 LOW. Otherwise, the program falls through to step 332 whereupon both the cycle relay 110 and the down start winding TRAIC 174 are deactivated by driving microcomputer 134 output lines 182 and 170, respectively, HIGH. Driving microcomputer 134 output line 170 HIGH has no effect on the auxiliary winding 104a if output line 170 was already HIGH. The program then calls the PAUSE routine 800 at step 324.

After completion of a normal refuse compaction stroke, the PAUSE routine 800 provides a preset two second pause period with the ram assembly at the bottom of the stroke. This provides additional refuse compaction time without significantly adding to the total cycle time. The user can invoke the "solid pack" cycle by pressing the start button sometime during the two second pause period. If the "solid pack" cycle is invoked, the PAUSE routine 800 will not return to the MAIN program 30 until twenty-four additional seconds have elapsed, or, until the user terminates the "solid pack" cycle by again pressing the start button. The MAIN program 300 calls the UP routine 850 at program step 336.. The UP routine 850 starts the motor 100 such that the ram assembly moves in the up direction toward the home, or storage position. The refuse compactor drawer assembly 15 will not open unless the ram assembly is in, or near, the home position. the UP routine 850 returns to the MAIN program 300 at program step 340 when the top limit switch has indicated that the ram has returned to the home position, or, when a stalled motor 100 has been detected. The cycle relay 110 is deactivated at program step 340 by driving a microcomputer 134 output line 182 HIGH. The program then loops back to decision step 302 to await user initiation of the next cycle.

Figure 13:
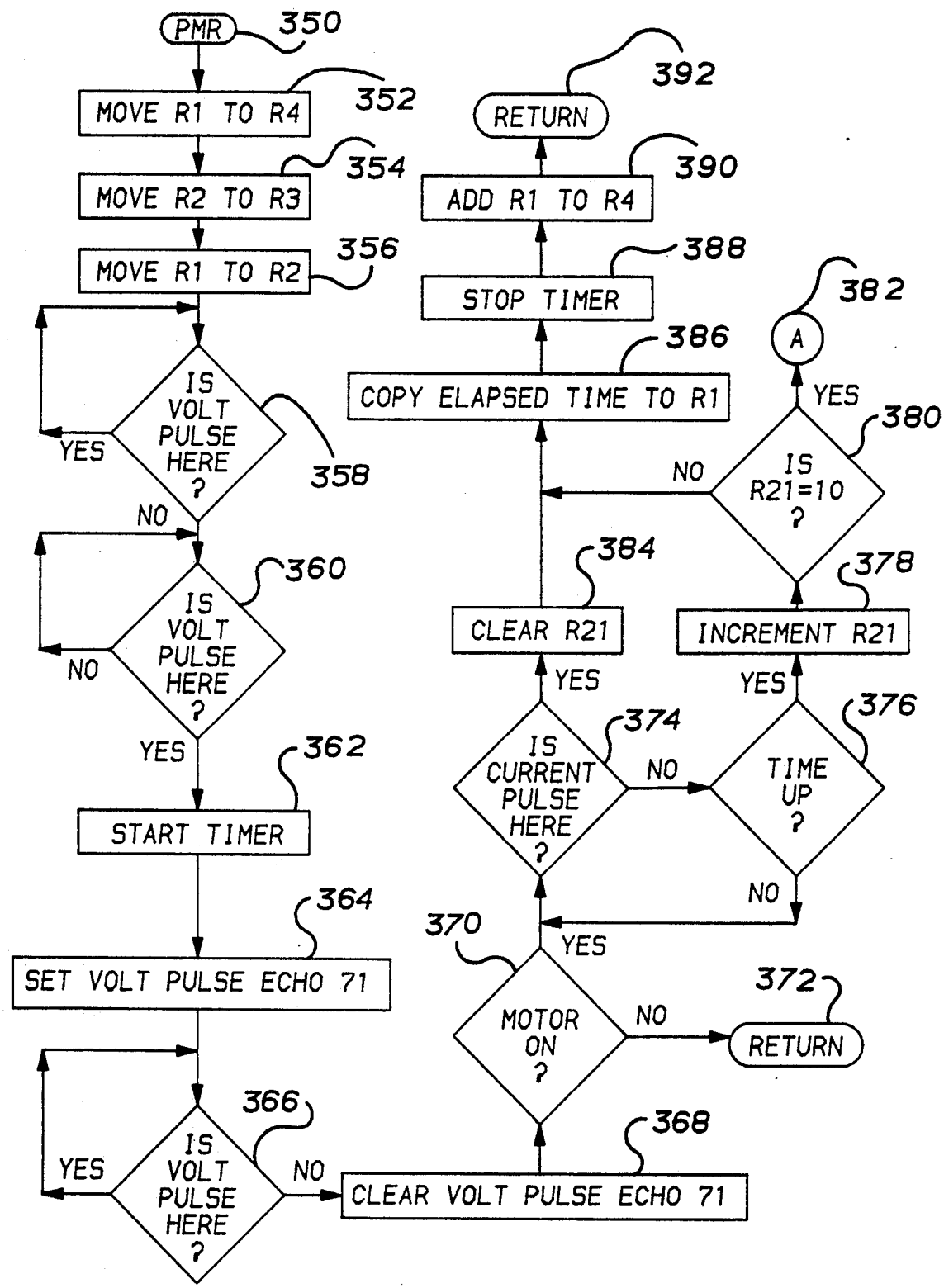
FIG. 13 is a flow chart for the phase monitoring routine to monitor the lagging main winding phase angle when the motor is ON, and further, to provide a one half line cycle delay when the motor if OFF.

FIG. 13 is a flow chart of the phase monitoring routine PMR 350. The phase monitoring routing PMR 350 is used to monitor the lagging main winding phase angle when the motor 100 is ON, or, to provide a one half line cycle delay when the motor is OFF. The phase monitoring routine PMR 350 may be called as often once per lien half cycle, or, 120 times per second for a 60 Hz service frequency. When the motor is ON, the phase monitoring routing PMR 350 returns to the calling program with the last, second last and third last main winding motor phase numbers in data memory registers R1, R2 and R3, respectively, and, the sum of the last two main winding motor phase numbers in register R4. This information is available for use by the calling routine.

The phase monitoring routine PMR 350 is called by the motor start routing MSR 400, the trash compaction routine TCR 500 and the UP routine 850 once per line cycle, or, 120 times per second, to use the crystal controlled microcomputer 134 clock to monitor the time from the leading edge of the volt pulse 240 to the leading edge of the current pulse 135. The phase monitoring routine PMR 350 is also called with the motor 100 OFF by the PAUSE routine 800 to mark time for one line half cycle. More specifically, the phase monitoring routine PMR 350 begins by preparing to accumulate the sum of the last two main winding 102 phae numbers in register R4 by moving the last main winding phase numbers in register R1 to register R4 at program step 352. Program steps 354 and 356 adjust the data stack of the last three main winding phase numbers by moving the second last phase number in register R2 to register R3 in step 354, and moving the last phase number in register R1 to register R2 at step 356. The phase monitoring routine PMR 350 then loops through decision step 358 until the volt pulse is gone. The purpose of step 358 is to avoid initiating a phase sample in the middle of a volt pulse.

Decision setup 360 causes the program to loop until the arrival of the leading edge of the next volt pulse whereupon the program falls through to step 362. The microcomputer 134 timer is started at program step 362. The volt pulse echo lie 144 from the microcomputer 134 to the watchdog circuit 142 is driven LOW at program step 364. The program loops through decision step 366 until the volt pulse is gone, whereupon the volt pulse echo line 144 is restored to the HIGH state at program step 368. Decision step 370 causes the program to return to the calling routing at step 372 if the motor 100 is OFF; otherwise, the program falls through to decision step 374.

The program loops through decision steps 374 and 376 until either a current pulse arrives, or, a preset time limit has expired. The time limit may cone into play for a few lien half cycles after the coil 186 has been energized, but before the cycle relay contact 110 has made, or, in the event of a motor 100 thermal overload 106 trip. If the time limit expires at decisions step 376 before the arrival of a current pulse, the missing curent pulse count register R21 is incremented at step 378. Decisions tep 380 branches from point A at step 382 to point A at step 338 of the MAIN program 300 to abort the present cycle if the missing current pulse count register R21 is ten. In other words, the present cycle is aborted if the motor 100 thermal protector 106 has tripped, or, if there is an open anywhere in the motor 100 circuit which causes the absence of a current pulse 135 for ten consecutive line half cycles. Otherwise decisions step 380 branches to step 386.

Normally, the program falls through decision step 374 to step 384 upon the arrival of the next current pulse 135. At program step 384 the missing current pulse count register R21 is cleared. At step 386 the present value of the timer is read into data memory register R1. This involves both reading the present value of the microcomputer timer and keeping track of the number of timer rollovers, a procedrue which is known to those skilled in the art. The microcomputer timer is stopped at step 388. And, the last main winding 102 phase number in register R1 is added to the present value of register R4 in step 390. The program returns to the calling routine at step 392 with the sum of the last two consecutive main winding 102 phase numbers in register R4 and the last, second last and third main winding phase numbers in registers R1, R2 and R3, respectively. All data processing and decision making by the calling program will be completed before the arrival of the next volt pulse through the speed of the microcomputer 134. The sum of the last two main winding phase numbers in register R4 represents data from one odd and one even numbered line voltage half cycle and thereby tends to cancel the effect of component variation between comparators CM2 and CM3, and, the effects of positive and negative half cycle line voltage asymmetry.

Figure 14:
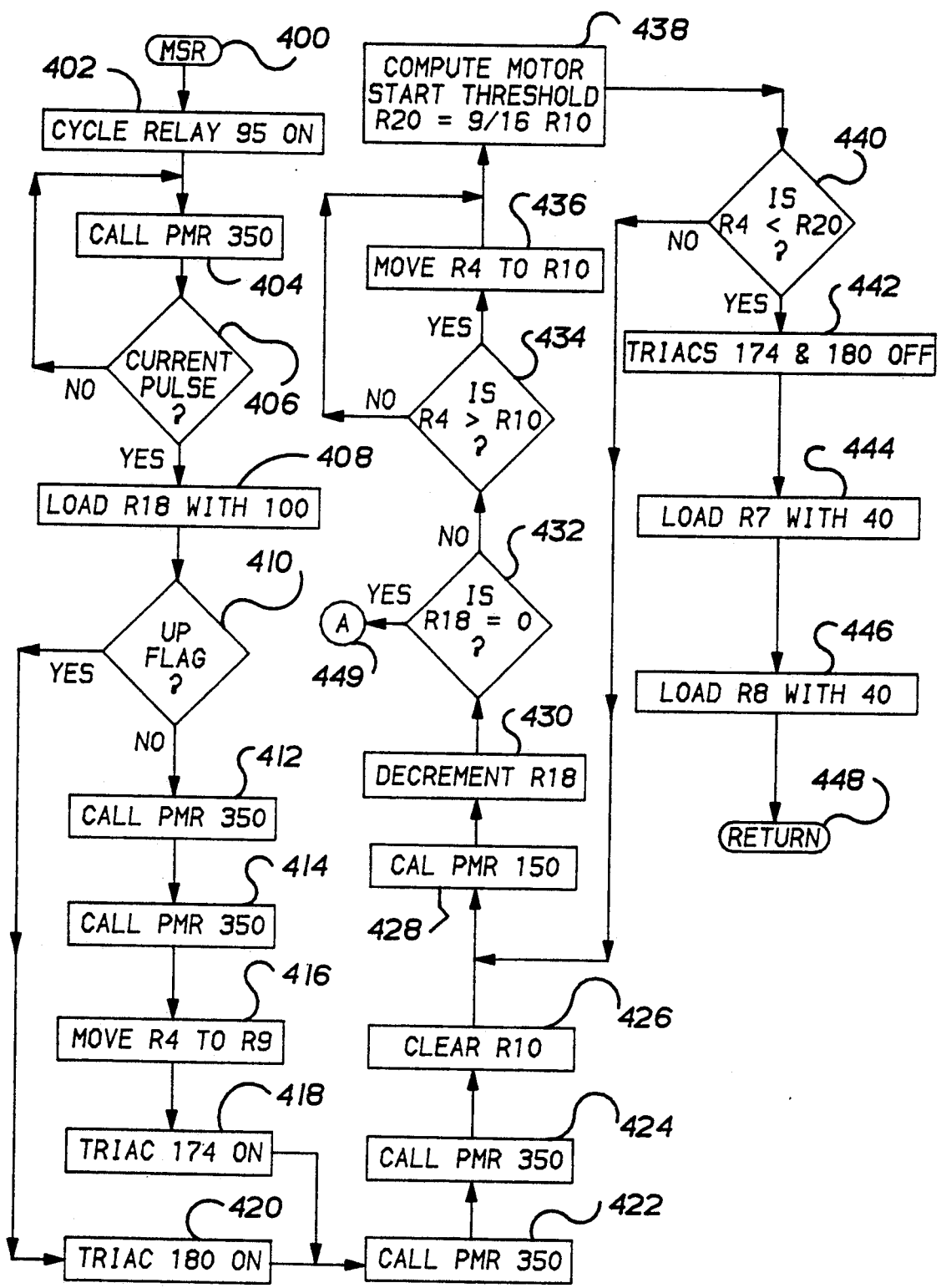
FIG. 14 is a flow chart for the motor start routine.

FIG. 14 is a flow chart for the motor start routine MSR 400. The motor start routine MSR 400 calls the phase monitoring routine PMR 350 as a subroutine at six program locations. The motor start routine MSR 400 starts the motor in the ram-up or the ram-down direction depending on the status of the UP flag. The motor start routine MSR 400 uses a programmed referenced technique to monitor a characteristic percentage decrease in the main winding motor phase angle which occurs when the motor has accelerated sufficiently to develop more torque without the auxiliary winding. In addition to starting the motor, the motor start routine MSR 400 samples two motor phase parameters which are available for use at a later time in the same cycle by the LOW routine 650 and the HIGH routine 750 to define specific portions of the compaction stroke.

During motor 100 starting the main winding 102 phase numbers start out large when the speed of the motor 100 is low and decrease in a characteristic manner as the motor 100 comes up to speed. The motor start routine MSR 400 detects when the motor 100 has accelerated to approximately seventy-five percent of synchronous speed by monitoring the maximum sum of two consecutive main winding phase number, and, deactivating the auxiliary winding when the sum of the last two motor phase numbers has dropped below a threshold of nine sixteenths of the maximum sum. This threshold has been found to be accurate for the entire production distribution of motors 100, over the widest range of service voltage, and, a variety of motor 100 winding M, S1 and S2 temperatures.

The motor start routine MSR 400 also monitors the sum of two consecutive locked rotor main winding phase numbers just prior to activating the auxiliary winding S1 when the motor 100 is being started in the direction which moves the ram assembly 32 down. The motor start routine MSR 400 is capable of starting the motor 100 in the ram up, or ram down direction in accordance with the UP flag as set by the UP routine 850. More specifically, the motor start routine MSR 400 activates the cycle relay 110 at step 402 by driving microcomputer 134 output line 182 LOW. The program loops through steps 404 and 406 until the cycle relay contacts 110 close. Specifically, step 4-4 calls the phase monitoring routine PMR 350 and decision step 406 interrogates register R1 to determine whether or not the phase monitoring routine PMR 350 timed out. The program falls through to step 408 when the relay contact 110 has closed and a main winding current pulse has been detected by the phase monitoring routine PMR 350. Program step 408 defines a maximum motor 100 start time of five-sixth of one second by loading register R18 with 100. Decision step 410 branches to step 420 if the UP routine 850 has set the UP flag. Program step 420 activates the auxiliary winding S2 which starts the motor 100 in the direction which brings the ram assembly toward the home position in the up direction.

Otherwise, the program falls through decision step 410 to step 412. Program steps 412, 414 and 416 sample the sum of two consecutive motor 100 locked rotor main winding 102 phase numbers and store the result in register R9. This parameter will be used later by the LOW routine 650 to define a motor 100 phase threshold to terminate the low force compaction cycle. Specifically, step 412 calls the phase monitoring routine PMR 350 a first time to load register R1 with a locked rotor, or zero RPM, main winding phase number. Step 414 calls the phase monitoring routine PMR 350 a second time to load register R4 with the sum of two consecutive lock rotor main winding 16 phase numbers. Step 416 moves the sum of the last two main winding phase numbers in register R4 to register R9 for later use by the LOW routine 650. Program step 418 activates the auxiliary winding 104a which starts the motor 100 in the direction which moves the ram assembly 32 down for refuse compaction. Program steps 422 and 424 call the phase monitoring routine PMR 350 a first and second time with the auxiliary winding ON to accumulate good data in memory registers R1, R2 and R4. The maximum sum of the two motor phase numbers in register R10 is initialized to a low value at program step 426.

Program steps 428 through 440 define a criterion which uses a characteristic decrease in main winding phase angle as the split phase induction motor 100 accelerates to determine the appropriate time to deactivate the auxiliary winding 104a or 104b. Specifically, program step 428 calls the phase monitoring routine PMR 350. The phase monitoring routine PMR 350 returns to the motor start routine MSR 400 with the sum of the last two consecutive main winding phase numbers in register R4. The motor start time limit in register R18 is decremented at step 430, and, decision step 432 determines whether the motor 100 has failed to start within the allotted time limit. If register R18 has decremented to zero, the program branches from point A at step 449 of the motor start routine MSR 400 to point A st step 338 of the MAIN program 300 to abort the present cycle regardless of the position of the ram assembly 32. Otherwise, the program falls through decision step 432 to decision step 434.

Program steps 434 and 436 store the maximum sum of two consecutive main winding phase numbers throughout the motor 100 start procedure in register R10. This number is used to define a motor start threshold, and, a threshold for terminating the high compaction force cycle by the HIGH routine 750. Specifically, decision step 434 branches to step 438 if the sum of the last two main winding phase numbers is not a new maximum sum. Of, if the sum of the last two consecutive main winding phase numbers in register R4 is greater than the previous maximum sum of two consecutive main winding phase numbers in register R10, the program falls through to step 436 wherein the new maximum sum is stored in register R10. Note that the program always falls through to step 436 on the first pass because register R10 was cleared at step 426.

Program step 438 computes the motor start threshold in register R20 by a procedure that is known to those skilled in the art. Division by any multiple of two and multiplication by successive additions are within the capability of most 8-bit microcomputers 134. In fact, the preferred microcomputer, the Texas Instrument TMS7020, employs a specific multiply instruction. Specifically, the value in register R10 is moved to register R20. The value of register R20 is divided by two, four times. And, the value in register R20 is added to itself eight more times so that the resulting value in register R20 is approximately nine-sixteenths of the value in register R10. If the sum of the last two main winding 16 phase numbers in register R4 is less than the motor start threshold in register R20, the motor 100 has started.

Specifically, decision step 440 loops back to step 428 for the next main winding phase sample if the sum of the last two main winding phase numbers is not less than the motor start threshold in register R20. Otherwise, the program falls through decision step 440 to step 442 to terminate the motor 100 start procedure. Program step 442 turns both TRIACs 174 and 180 OFF. The TRIAC 174 or 180 which is already OFF is unaffected by step 442. Program steps 444 and 446 load motor 100 stall detection parameters which, in conjunction with the STALL routine 450, provide an independent means of detecting a stalled motor 100 throughout the compaction stroke, and, while the ram assembly 32 is being returned to the home position. Specifically, the stall sum of differences threshold register R7 is loaded with forty at step 444, and, the stall comparison count threshold register R8 is loaded with forth at step 446. The program returns to the calling routine with the motor 100 started at step 448.

Figure 15:
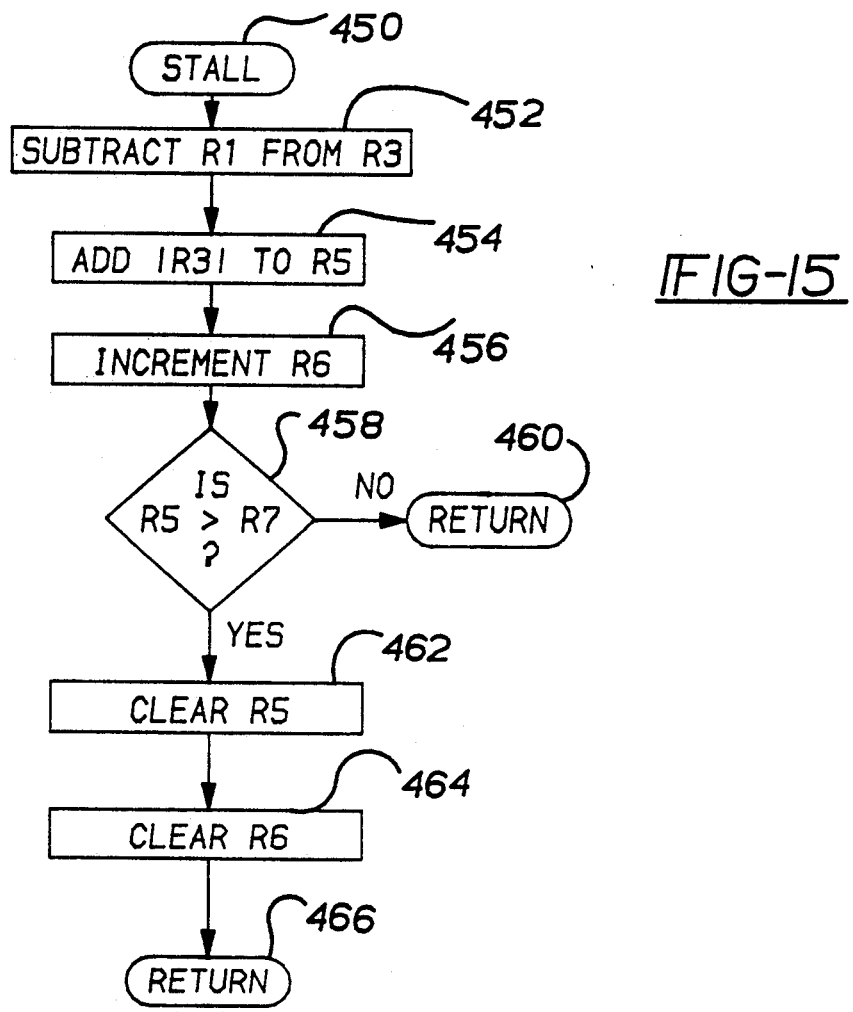
FIG. 15 is a flow chart for the STALL routine to detect a stalled motor condition.

FIG. 15 is a flow chart for the STALL routine 450. The STALL routine is called by the trash compaction routine TCR 500 and the UP routine 850 once per each line half cycle to provide a means of detecting a stalled motor via a lack of variation in the main winding motor 100 phase samples.

It should be noted that there is no such thing as an absolutely constant motor 100 torque in the trash compactor 10, or, in any other major appliance induction drive motor, when the motor is operating in a normal manner. Hence, if the main winding phase numbers become relatively constant, it can be inferred that the motor 100 has stalled. It is necessary, however, to avoid comparing data from consecutive main winding phase samples because positive and negative half cycle line voltage asymmetry, or, component variation between comparators CM2 and CM3 can introduce sufficient apparent variation in the data as to prevent detection of a stalled motor. The STALL routine 450 accumulates the absolute value of the difference between the last and the third last main winding phase number in register R5 for a sample period defined by the value in the stall comparison count threshold register R8. The calling routine determines whether or not the motor 100 is stalled by comparing the sum of differences in register R5 to the stall sum of difference threshold in register R7. The values of the stall sum of difference threshold in register R7 and the stall comparison count threshold in register R8 are defined by the motor start routine MSR 400 and altered to a more sensitive threshold by the HIGH routine 750. The sum of differences in register R5 and, the stall comparison count in register R6 are cleared by the stall routine upon the completion of each sample; i.e., when a determination has been made that the motor 100 is not stalled.

More specifically, the STALL routine 450 subtracts the last main winding phase number in register R1 from the third last main winding phase number in register R3 in step 452. The absolute value of the difference in register R3 is added to the sum of differences register R5 in step 454. The stall comparison count register R6 is incremented at step 456. Decision step 458 returns to the calling program at step 460 if the sum of differences in register R5 is not greater than the stall sum of differences threshold in register R7. Otherwise, the motor is not stalled and the program falls through to steps 462 and 464 to re-initiate the stall detection parameters for a new sample. Specifically, the sum of differences register R5 is cleared at stp 462, and, the stall comparison count register R6 is cleared at step 464. The program returns to the calling routine at step 466. The motor 100 is not stalled and a new sample will begin with the next pass through the STALL routine 450.

Figure 16:
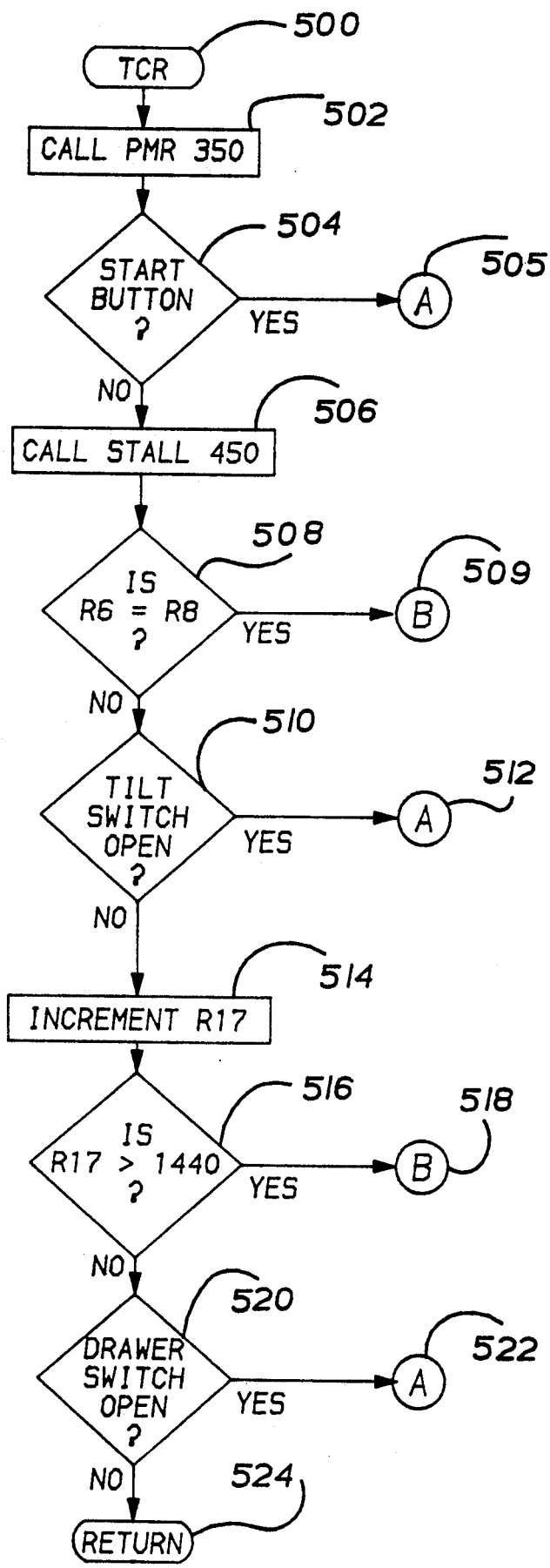
FIG. 16 is a flow chart for the trash compaction routine.

FIG. 16 is a flow chart for the trash compaction routine TCR 500. The trash compaction routine TR 500 is called once per line half-cycle or 120 times per second, by the DOWN routine 600, the LOW routine 650, the MEDIUM routine 700 and the HIGH routine 750 to provide the common program steps required by each routine. The trash compaction routine TCR 500 calls the phase monitoring routine PMR 350; aborts the cycle if the user has re-pressed the start button; calls the STALL routine 450, and, aborts the cycle if a stalled motor condition is detected; aborts the compaction stroke if the tilt switch trips; aborts the cycle if an overall time limit has expired; and, aborts the compaction stroke if the drawer is open. Otherwise, the trash compaction routine TR 500 returns to the calling routine with new motor phase information available in data memory registers R1, R2, R3 and R4.

The trash compaction routine TCR 500 calls the phase monitoring routine PMR 350 at step 502. Decision step 504 aborts the present cycle by transferring program control from point A at step 505 to point A at step 338 of the MAIN program 300 in the event that the user has pressed the start button and driven the start button input 168 LOW. In other words, the start button becomes a step button, or, panic button, during the compaction stroke or during ram assembly 32 return to the home position. Otherwise, the program falls through decision step 504 to step 506. The STALL routine 450 is called at step 506. Decision step 508 aborts the compaction stroke if the STALL routine 450 returns to the trash compaction routine TCR 500 with the stall comparison count in register R6 equal to the stall comparison count threshold in register R8. In other words, if the sum of differences between the last and the third last main winding phase numbers in register R5 is still below the stall sum of differences threshold in register R7 over a sufficient sample period, the motor 100 is stalled and the program branches from point B at step 509 to point B at step 326 of the MAIN program 300 to force completion of the present compaction stroke. Decision step 510 aborts the present cycle if the tilt switch 162 trips during a compaction stroke by branching from point A at step 512 to point A at step 338 of the MAIN program 300. Otherwise, the elapsed time register R17 is incremented at step 514. Decision step 516 defines a maximum time limit for the compaction stroke by branching from point B at step 518 to point B at step 326 of the MAIN program 300 if the elapsed cycle time exceeds 1440, or, twelve seconds. Decision step 520 aborts the present cycle if the drawer switch 160 trips during a compaction stroke by branching from point A at step 522 to point A at step 338 of the MAIN program 300. Otherwise, the program returns to the calling routine at step 524 with the sum of the last two main winding phase numbers in register R4, and, the last, second last and third last main winding phase numbers in registers R1, R2 and R3, respectively, and, the elapsed cycle time register R17 incremented.

Figure 17:
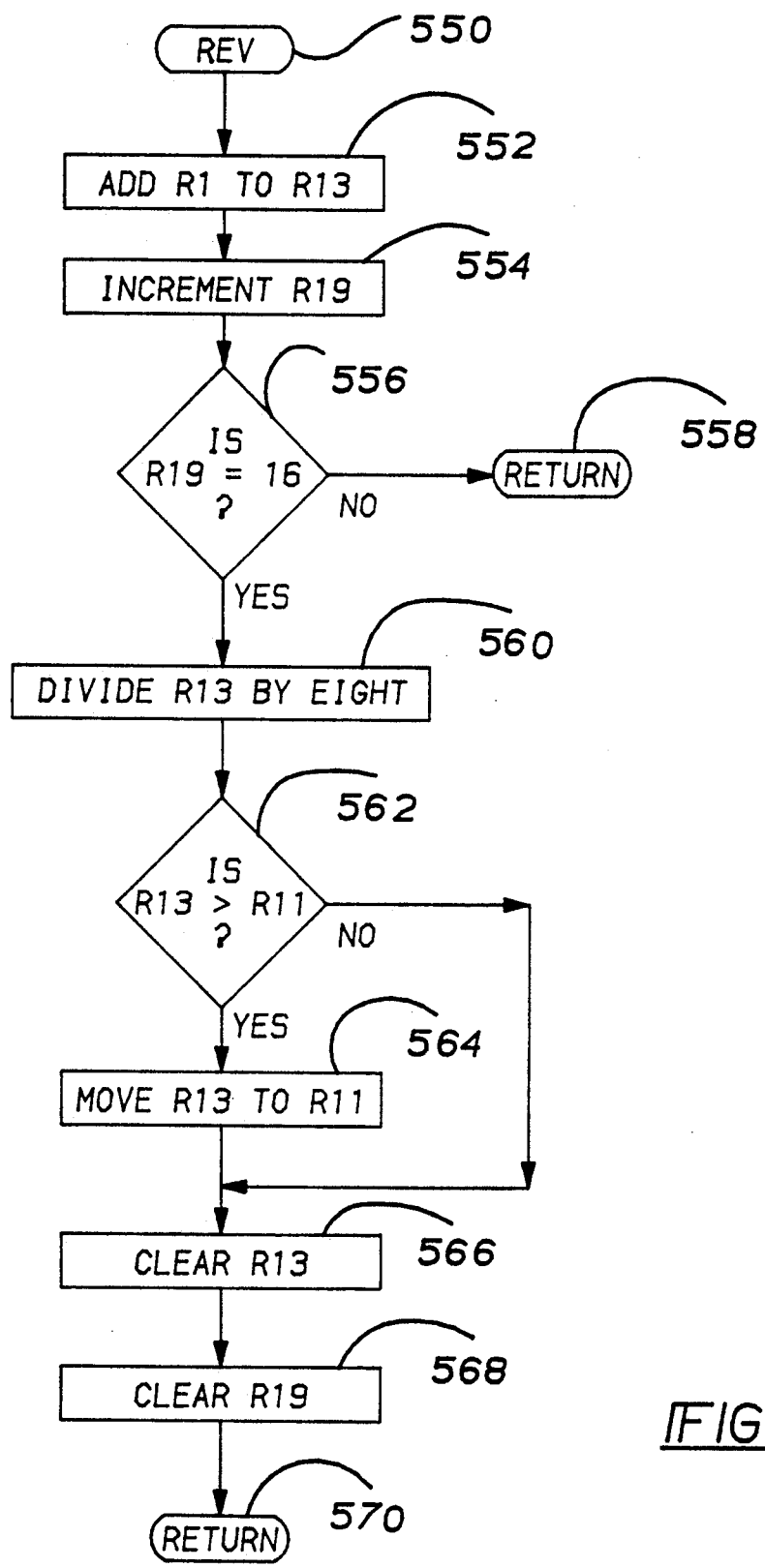
FIG. 17 is a flow chart for the revolution routine to accumulate successive sums of motor phase numbers and compute a minimum base line torque value for use in the down routine.

FIG. 17 is a flow chart for the revolution routine REV 550. The revolution routine REV 550 is called once per line half cycle or 120 times per second, by the DOWN routine 600 to facilitate detection of an increase in motor torque at the actual onset of refuse compaction or ram bottoming. The revolution routine REV 550 accumulates successive sums of motor phase numbers for a sample time approximately corresponding to one revolution of the drive screws 44a and 44b. The results are used to compute a minimum torque baseline value for use by the DOWN routine 660.

The revolution sample sum register R13 and the drive screw revolution sample time register R19 have been cleared by the DOWN routine 600 prior to the first calling of the revolution routine REV 550. More specifically, the revolution routine REV 550 adds the last main winding phase number in register R1 to a revolution sample sum register R13 at program step 552. The drive screw revolution sample time register R19 is incremented at step 554. Decision step 556 returns to the DOWN routine 600 at step 558 if the sample is incomplete. Otherwise, the present sample is complete and the program falls through decision step 556 to step 560 whereupon the sum of the last sixteen main winding phase numbers in register R13 is divided by eight. This can be accomplished by dividing the value in register R13 by two, three times. The result of this division is a ram bottom threshold number representing the average motor 100 torque for a single revolution of the drive screws 44a and 44b. Program steps 462 and 464 store the maximum ram bottom threshold number in register R11. Specifically, decision step 462 branches to step 466 if the last threshold number in register R13 is not greater than the previous maximum ram bottom threshold number in register R11. If the threshold in register R13 is not a new maximum, program step 562 branches directly to step 566. Otherwise, the program falls through decision step 562 to step 564 and the new maximum threshold number in register R13 is moved to register R11. Program steps 566 and 568 prepare to sample the motor torque for the next revolution of the drive screws 44a and 44b. Specifically, the revolution sample sum in register R13 is cleared at step 566, and, the drive screw revolution sample time in register R19 is cleared at step 568. The program returns to the DOWN routine 600 at step 570 with a ram bottom threshold in register R11 available for use by the DOWN routine 600.

Figure 18:
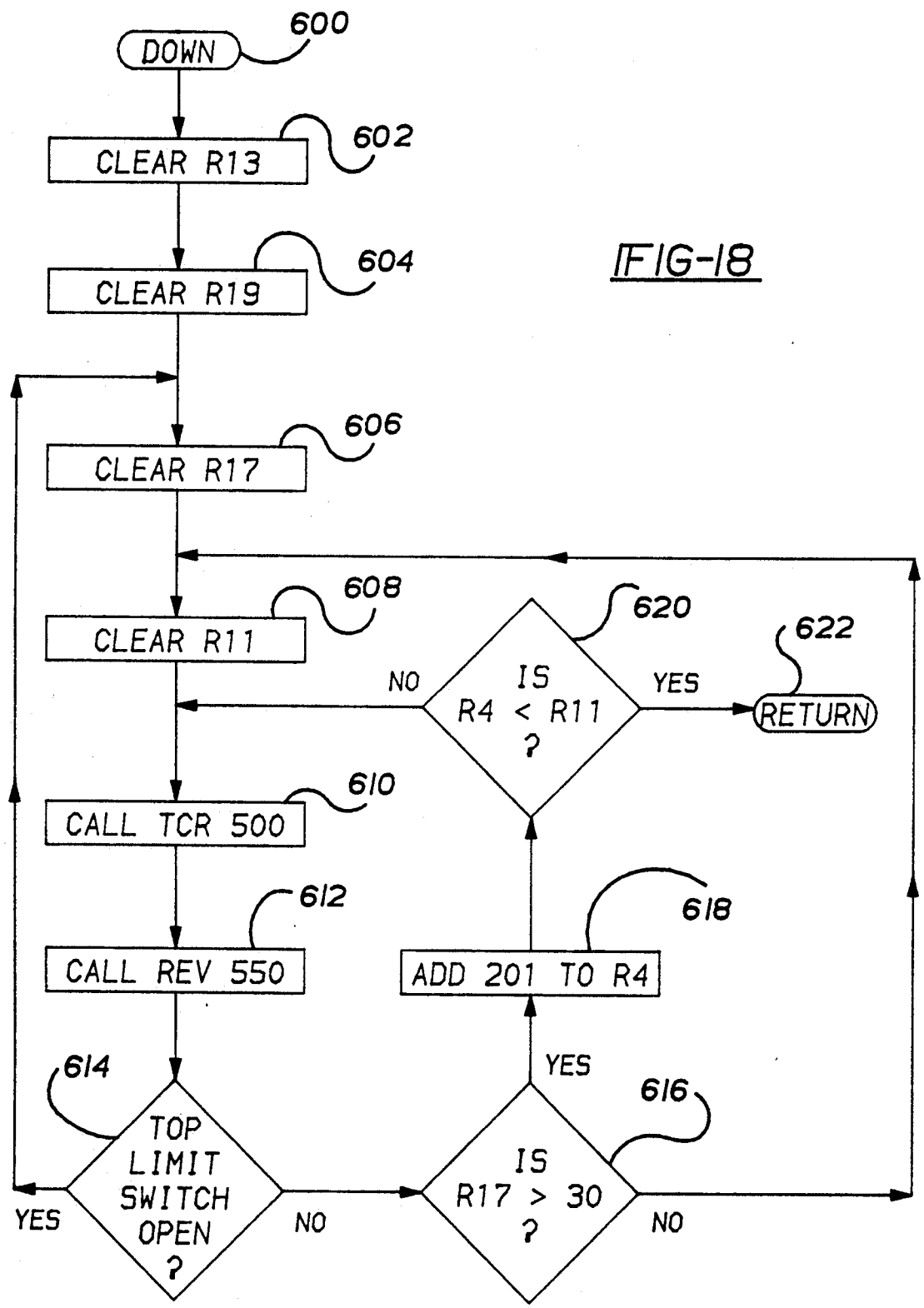
FIG. 18 is a flow chart for the DOWN routine for comparing the sum of the last two motor phase numbers for a base line motor torque threshold to provide rapid detection of the transition to compaction, or, ram bottoming.

A flow chart for the DOWN routine 600 is shown in FIG. 18. The DOWN routine 600 is called by the MAIN program 300 after the motor 100 is started with the ram assembly 32 moving in the down, or refuse compaction, direction. The DOWN routine 600 calls the trash compaction routine TCR 500 and the revolution routine REV 550 one per each line half cycle, or, 120 times per second. The DOWN routine compares the sum of the last two consecutive main winding 102 phase numbers in register R4 to a ram bottom threshold in register R11 provided by the revolution routine REV 550 to provide rapid detection of the transition from free, unhindered travel of the ram assembly 32 to the onset of actual refuse compaction, or, ram bottoming. The DOWN routine 600 returns to the MAIN program 300 at the start of the actual refuse compaction portion of the stroke, with the motor 100 load torque increasing and the main winding phase numbers decreasing.

More specifically, the DOWN routine 600 clears the revolution sample sum register R13 at step 602, and, the drive screw revolution sample time register R19 at step 604 prior to the first calling of the revolution routine REV 550. The elapsed cycle time register R17 is cleared at step 606. The ram bottom threshold register R11 is cleared at program step 608. The trash compaction routine TCR 500 is called at step 610. The trash compaction routine TCR 500 returns to the DOWN routine with the sum of the last two consecutive main winding phase numbers in register R4 and the elapsed cycle time register R17 incremented. The revolution routine REV 500 is called at step 612. The revolution routine REV 550 accumulates sums of sixteen consecutive main winding phase numbers representing the torque required to turn the drive screws 44a and 44b through approximately one revolution and computes a ram bottom threshold in register R11. Decision step 614 branches back to step 606 until the ram assembly 32 has cleared the top limit switch 158. The top limit switch 158 is very accurately positioned at the time of manufacture. The elapsed cycle time in register R17 is used to determine the position of the ram assembly 32 by the MAIN program 300 to determine if the ram assembly 32 is about to bottom-out, or, if the trash bag is full. Hence, clearing the elapsed cycle time in register R17 at program step 606 until the ram assembly 32 has cleared the top limit switch 158 facilitates an accurate means of inferring the ram position. If the ram assembly 32 has cleared the top limit switch 158, the program falls through decision step 614 to decision step 616. Decision step 616 branches back to step 608 to clear the ram bottom threshold in register R11 for the first portion of the stroke because the initial main winding phase numbers are biased while the motor 100 may still be coming up to full speed.

After the motor 100 has been running for a sufficient time to be fully accelerated, the program falls through decision step 616 to program step 618, wherein a fixed bias number is added to the sum of the last two main winding phase numbers in register R4. Decision step 620 returns to the MAIN program 300 at step 622 if the biased sum of the last two consecutive main winding phase numbers in register R4 is less than the ram bottom threshold in register R11. The compaction forces are increasing and the main winding phase numbers are decreasing. The motor 100 is operating just to the right of point 72 on the speed-torque curve or FIG. 3. Otherwise, the program falls through decision step 620 to step 610 wherein the trash compaction routine TCR 500 is called to obtain the next main winding phase sample.

Figure 19:
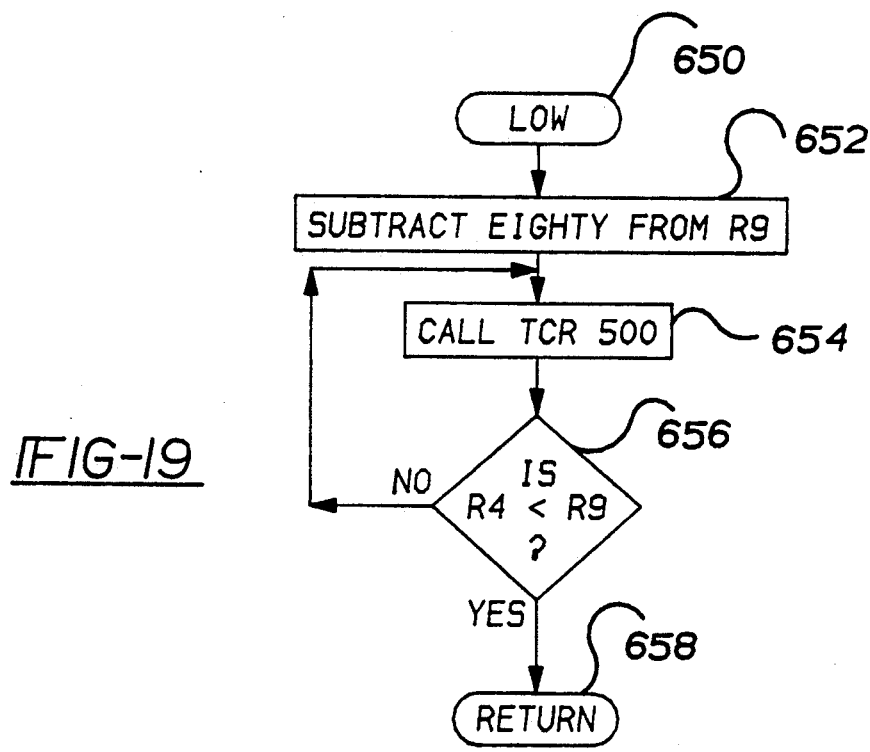
FIG. 19 is a flow chart for the LOW routine to detect when the load force exceeds a computed threshold below the available motor breakdown torque.

A flow chart for the LOW routine 650 is shown in FIG. 19. The LOW routine 650 is called by the MAIN program 300 in the low, medium and high compaction force cycles immediately after the DOWN routine 600 has determined that the refuse compaction portion of the stroke has started. The LOW routine 650 computes a main winding 102 phase threshold in register R9 from a locked rotor, or low RPM, main winding phase sample acquired by the motor start routine MSR 400 at the start of the present cycle. The LOW routine 650 calls the trash compaction routine TCR 500 once per each line half cycle, or, 120 times per second, and compares the sum of the last two main winding 16 phase numbers in resister R4 to the threshold in register R9. The LOW routine 650 returns to the MAIN program 300 as soon as the compaction force exceeds the threshold and with the motor 100 torque just beginning to approach the breakdown torque region of the motor 100 speed-torque curve. The main program terminates the compaction stroke at this point if the low compaction force cycle is active; otherwise, the main program calls the MEDIUM routine 700.

More specifically, the LOW routine 60 subtracts a fixed bias number from the sum of two consecutive locked rotor main winding 102 phase numbers in register R9 at program step 652. The trash compaction routine TCR 500 is called at step 654. The trash compaction routine TCR 500 returns to the LOW routine 650 with the sum of the last two consecutive main winding phase numbers in register R4. Decision step 656 branches back to step 654 if the sum of the last two consecutive main winding phase numbers in register R4 is not less than the threshold number in register R9. Otherwise, the motor 100 torque is greater than the low force threshold and the program falls through decision step 656 to step 658. The program returns to the MAIN program 300 at step 658 with motor 100 operating approximately at point 80 of the speed-torque curve on FIG. 9.

Figure 20:
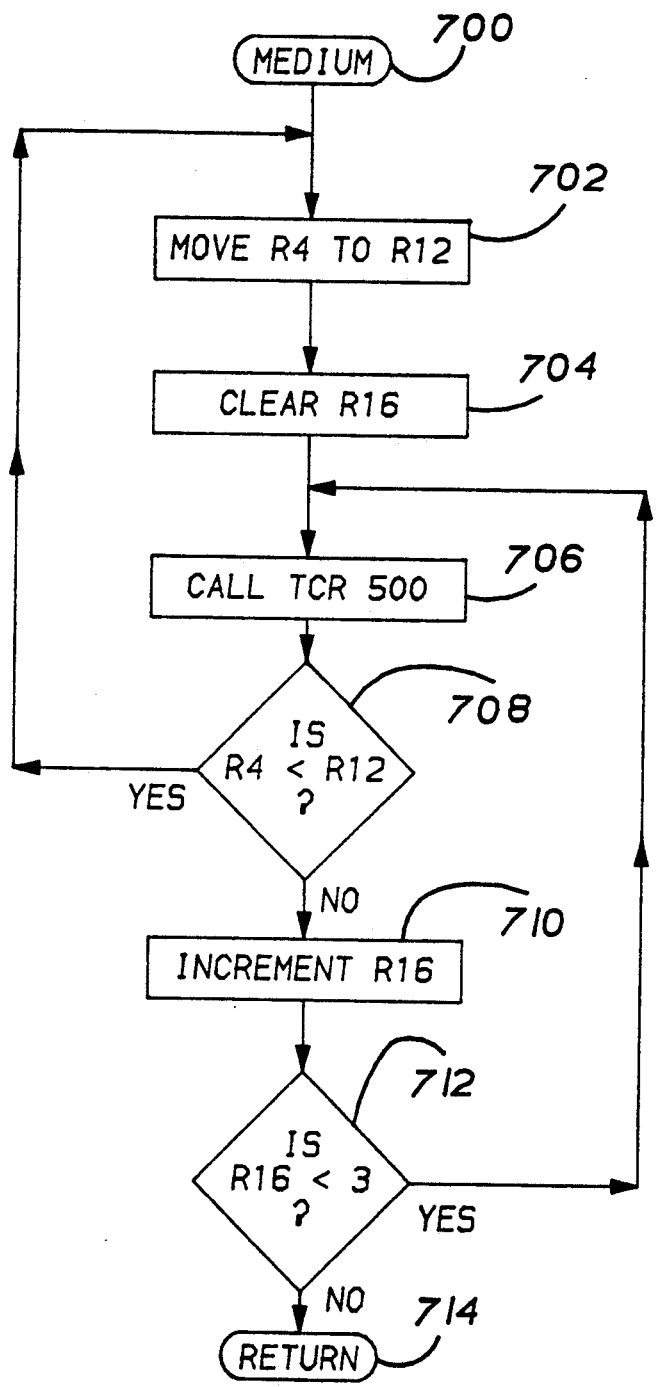
FIG. 20 is a flow chart for the MEDIUM routine to detect when the load torque has increased to a point just beyond the available motor breakdown torque.

A flow chart for the MEDIUM routine 700 is shown in FIG. 20. The MEDIUM routine 700 is called by the MAIN program 300 for the medium and high compaction force cycles to detect when the required load torque has increased to a point just beyond the available motor 100 breakdown torque. The MEDIUM routine 700 calls the trash compaction routine TCR 500 once per each line half cycle, or, 120 times per second for as long as the motor 100 torque is increasing, and, returns to the MAIN program 700 as soon as three consecutive line half cycles have occurred with no new minimum sum of the last two consecutive main winding 102 phase numbers. The MAIN program 300 terminates the compaction stroke at this point if the medium cycle is active; otherwise, the MAIN program 300 calls the HIGH routine 750.

More specifically, the MEDIUM routine 700 moves the sum of the last two consecutive main winding phase numbers in register R4 to the minimum sum of two consecutive main winding phase numbers in register R12 at program step 702. The breakdown count register R16 is cleared at step 704. The trash compaction routine TCR 500 is called at step 706. The trash compaction routine TCR 500 returns to the MEDIUM routine 700 with the sum of the last two main winding phase numbers in register R4. Decision step 708 branches back to step 702 if the motor 100 torque is still increasing. Specifically, decision step 708 branches back to step 702 if the sum of the last two main winding phase numbers in register R4 is less than the previous minimum sum of the last two main winding phase numbers in register R12. Otherwise, the program falls through decision step 708 to step 710 wherein the breakdown count in register R16 is incremented. Decision step 712 branches back to step 706 if the breakdown count is less than three. Otherwise, the motor 100 load torque has exceeded the main winding breakdown torque. In other words, three consecutive line half cycles have occurred with no new minimum sum of two consecutive main winding phase numbers. The program falls through decision step 712 and returns to the MAIN program 300 at step 714 with the motor operating approximately at point 78 of the motor speed-torque curve of FIG. 3.

Figure 21:
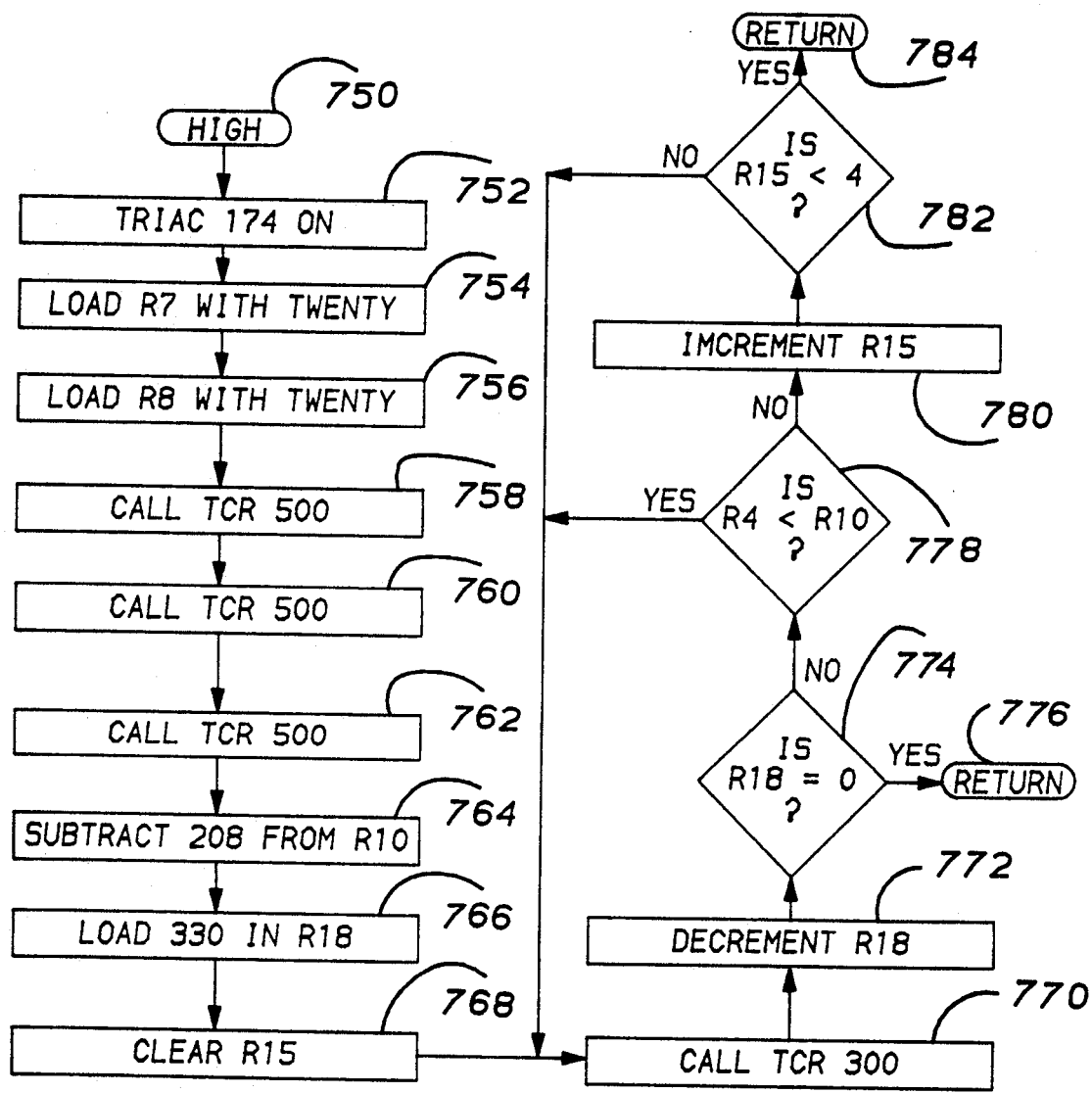
FIG. 21 is a flow chart for the HIGH routine to detect when the motor is stalling after obtaining additional torque by re-activating the motor ram DOWN start winding.

A flow chart for the HIGH routine 750 is shown in FIG. 21. The HIGH routine 750 is called by the MAIN program 300 for the high compaction force cycle with the load torque having just exceeded the available main winding 102 breakdown torque. The HIGH routine 750 provides additional motor 100 torque by re-activating the ram down auxiliary winding 104a. The main winding phase numbers abruptly shift to a low value and begin to increase with decreasing motor 100 RPM as the load torque increases. The HIGH routine 750 returns to the MAIN program 300 when the sum of the last two main winding phase numbers in register R4 exceeds a threshold referenced from the maximum sum of two consecutive main winding phase numbers as monitored at the start of the present cycle by the motor start routine MSR 400. The HIGH routine 750 also defines a time limit to protect the auxiliary winding 104a. The compaction stroke is then terminated by the MAIN program 300.

More specifically, the HIGH routine 750 activates the down auxiliary winding 104a TRIAC 174 at step 752 by driving microcomputer 134 output line 170 LOW. The STALL routine 450 threshold parameters are rest for increased sensitivity and steps 754 and 756. Specifically, the stall sum of difference threshold in register R7 is changed from forty to twenty at step 754, and, the stall comparison count threshold in register R8 is changed from forty to twenty at step 756. The trash compaction routine TCR 500 is called three successive times at steps 758, 780 and 782 to establish good data in the sum of two consecutive main winding phase number register R4 with the auxiliary winding 104a energized. A fixed bias is subtracted from the maximum sum of two consecutive main winding phase numbers during motor 100 starting in register R10 to define the threshold for termination of the high force compaction stroke. The start time limit of 2.75 seconds is defined at step 756 by loading 330 at register R18. A stall count register R15 is cleared at step 768. The trash compaction routine TCR 500 is called at step 770.

The trash compaction routine TCR 500 returns with the sum of the last two main winding phase numbers with the auxiliary winding 104a ON in register R4. The start winding time limit register R18 is decremented at step 772, and, decision step 774 returns to the MAIN program 300 at step 776 if the time limit has expired. Otherwise, the program falls through decision step 774 to decision step 778. Decision step 778 loops back to step 770 for the next main winding phase sample if the sum of the last two consecutive main winding phase numbers in register R4 is less than the threshold in register R10. Otherwise, the program falls through decision step 778 to step 780. The stall count register R15 is incremented in register R15 at step 780, and, decision step 782 loops back to step 770 for the next main winding 102 phase sample if the stall count in register R4 is less than four. Otherwise, the motor 100 speed has slowed sufficiently so that no further compaction will be achieved on this stroke, and, the program returns to the MAIN program 300 at step 784. The motor 100 is operating at approximately point 68 of the speed-torque curve of FIG. 3.

Figure 22:
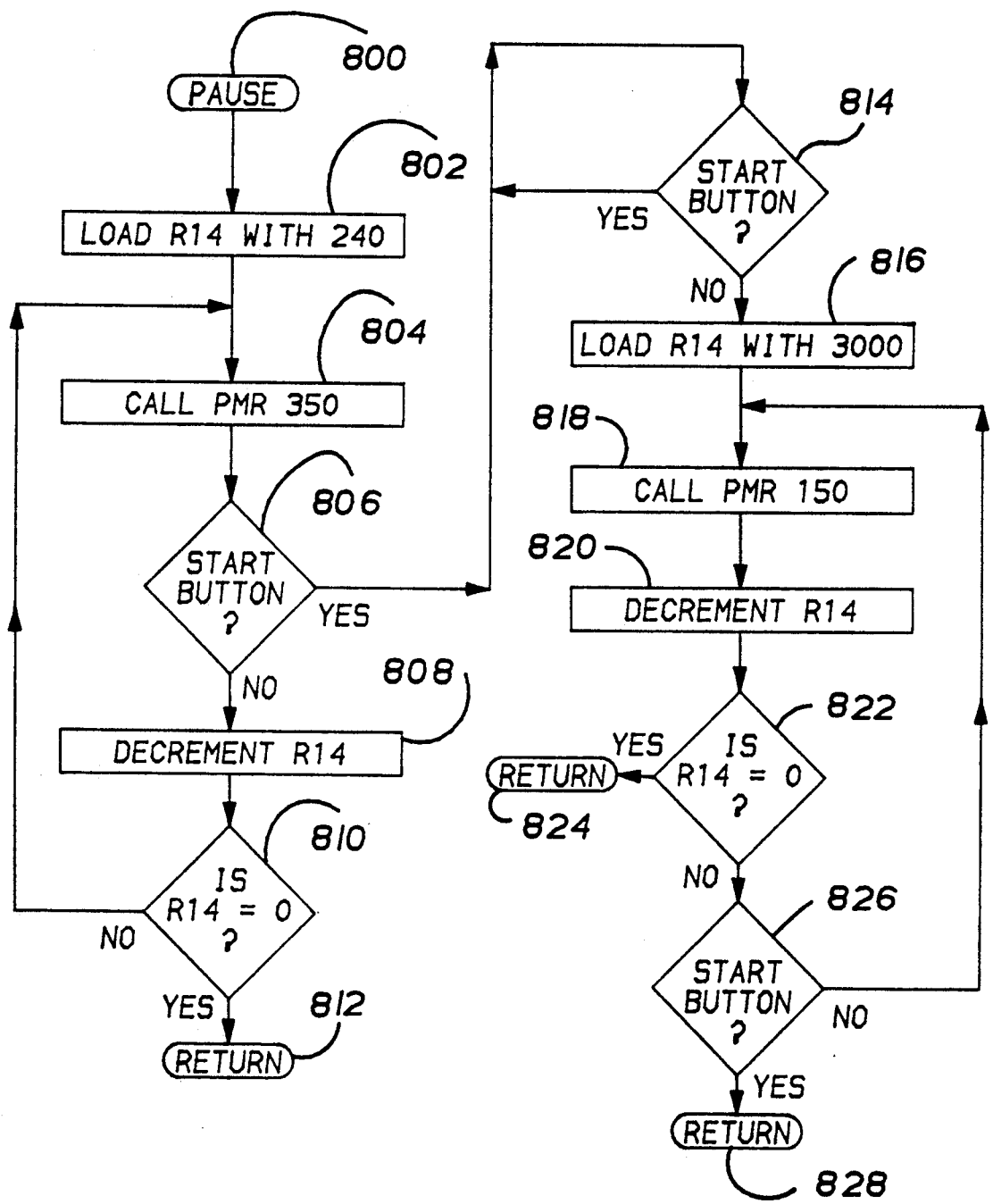
FIG. 22 is a flow chart for the PAUSE routine to prolong the maximum compaction period.

A flow chart for the PAUSE routine 800 is shown in FIG. 22. The PAUSE routine 800 is called by the MAIN program 300 with the ram assembly 32 at the bottom of the stroke. The PAUSE routine 800 calls the phase monitoring routine PMR 350 once per each line half cycle, or, 120 times per second, with the motor 100 OFF, to time out a two-second pause period with the ram assembly 32 compacting refuse to prolong the compaction period. The PAUSE routine 800 extends the pause period to twenty-five seconds if the user presses the start button 168 during the original two-second pause period. And, the PAUSE routine 800 aborts the remaining portion of the extended pause period if the user presses the start button during the extended pause period. The PAUSE routine 800 returns to the MAIN program 300 with the ram assembly 32 at the bottom of the stroke ready to be returned to the home, or storage, position.

More specifically, the PAUSE routine 800 loads the pause loop count register R14 with 240 for a two-second pause period at step 802. The phase monitoring routine PMR 350 is called with the motor 100 OFF at step 804. Decision step 806 branches to decision step 814 if the user presses the start button to activate the extended pause, or solid pack cycle. Otherwise, the program falls through decision step 806 to step 808 wherein the pause loop count in register R14 is decremented. Decision step 810 loops back to step 804 unless the pause loop count register R14 has been decremented to zero whereupon the program returns to the MAIN program 300 at step 812. If the start button 168 is pressed sometime during the original two-second pause period, the program branches to decision step 814 which loops back upon itself until the user releases the start button 168. When the user releases the start button 168, the program falls through decision step 814 to step 816. The pause loop count in register R14 is loaded with 3000 for a twenty-five second pause at step 816. The phase monitoring routine PMR 350 is called with the motor 100 OFF at step 818. The pause loop count in register R14 is decremented at step 820, and, decision step 822 returns the program to the MAIN program 300 via program step 824 if the pause loop count in register R14 has been decremented to zero. Otherwise, the program falls through to decision step 826 which returns the program to the main program via step 828 if the user has terminated the extended pause, or solid pack, cycle by pressing the start button sometime during the twenty-five second period. Otherwise, the program loops back to step 818.

Figure 23:
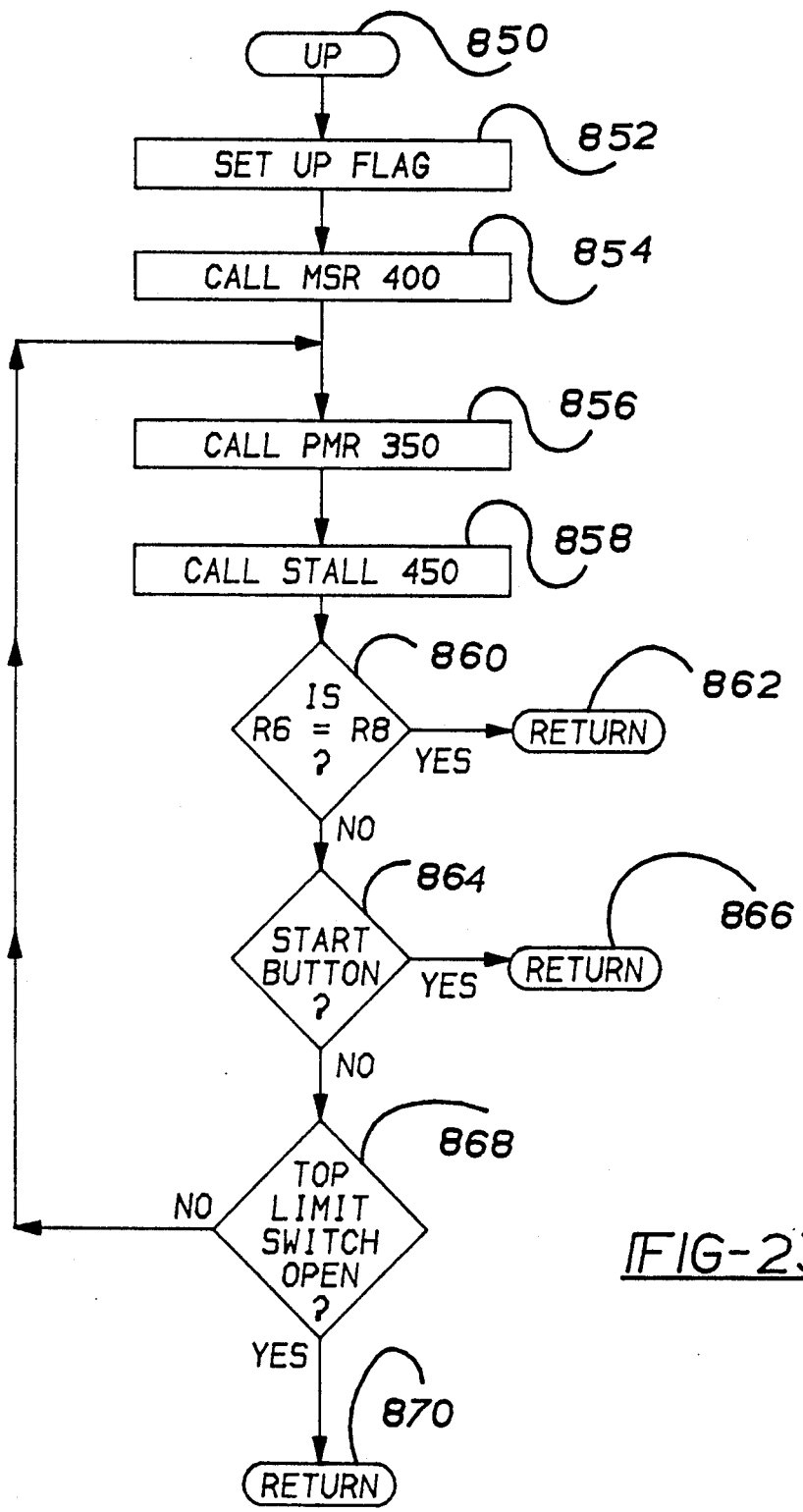
FIG. 23 shows a flow chart for the UP routine to return the ram to the home position.

A flow chart for the UP routine 850 is shown in FIG. 23. The UP routine is called by the MAIN program 300 to return the ram assembly 32 to the home position. The UP routine 850 calls the motor start routine MSR 400 with the UP flag set to start the motor 100 in the ram up direction. The UP routine 850 then calls the phase monitoring routine PMR 350 and the STALL routine 250 once per each line half cycle, or, 120 times per second. The present cycle is terminated when the ram assembly 32 reaches the home, or storage, position and trips the top limit switch 158.

More specifically, the UP routine 850 sets UP flag in microcomputer 134 data memory at step 852. The motor start routine MSR 400 is called at step 854 to start the motor in the ram up direction. The phase monitoring routine PMR 350 is called at step 856, and, the STALL routine 450 is called at step 858. If the STALL routine 450 returns with the stall comparison count in register R6 equal to the stall comparison count threshold in register R8, the motor 100 has stalled and decision step 860 aborts the present cycle by returning to the MAIN program 300 at step 862. Otherwise, the motor 100 is not stalled and the program falls through decision step 860 to decision step 864. Decision step 864 aborts the present cycle by returning to the MAIN program 300 via step 866 if the user has pressed the start button 168. Otherwise, the program falls through decision step 864 to decision step 868. Decision step 868 branches back to step 856 for the next main winding phase sample if the top limit switch input 158 is LOW. Otherwise, the ram assembly 32 has return to the home position and tripped the top limit switch whereupon the program is returned to the MAIN program 300 at step 870. The MAIN program 300 deactivates the cycle relay 110 by driving microcomputer 134 output line 182 HIGH to terminate the present cycle. The MAIN program 300 then awaits the start of the next cycle by monitoring the start switch input 168.

A listing of the microcomputer 40 data memory registers is shown below for use with the preferred Texas Instruments TMS7020 microcomputer 134 while this microcomputer has an 8-bit word size, to avoid unnecessary complication of the preceding flow charts, it has been assumed that the data memory registers have a 16-bit word size capability. Those who are skilled in the art will know how to include the necessary additional steps to achieve double precision, when necessary, with two 8-bit data memory registers. And, those who are skilled in the art will recognize opportunities to combine data memory registers which are not used concurrently.

DATA MEMORY ALLOCATION

R1—LAST MAIN WINDING 16 PHASE NUMBER
R2—SECOND LAST MAIN WINDING 16 PHASE NUMBER
R3—THIRD LAST MAIN WINDING 16 PHASE NUMBER
R4—SUM OF THE LAST TWO CONSECUTIVE MAIN WINDING 16 PHASE NUMBERS
R5—LAST/THIRD LAST ABSOLUTE SUM OF DIFFERENCES
R6—STALL COMPARISON COUNT
R7—STALL SUM OF DIFFERENCES THRESHOLD
R8—STALL COMPARISON COUNT THRESHOLD
R9—SUM OF TWO MAIN WINDING 16 LOCKED ROTOR PHASE NUMBERS
R10—MAXIMUM SUM OF TWO START NUMBERS
R11—RAM BOTTOM THRESHOLD
R12—MINIMUM SUM OF TWO MAIN WINDING 16 PHASE NUMBERS
R13—REVOLUTION SAMPLE SUM
R14—PAUSE LOOP COUNT
R15—STALL COUNT
R16—BREAKDOWN COUNT
R17—ELAPSED CYCLE TIME
R18—START WINDING TIME LIMIT
R19—DRIVE SCREW REVOLUTION SAMPLE TIME
R20—MOTOR START THRESHOLD
R21—MISSING CURRENT PULSE COUNT

It should be noted that prior art compactors required a centrifugal switch which detected motor speed and switched off the secondary winching in response to the speed increasing above predetermined levels. The centrifugal switch also detects when the speed decreases below a certain level, as occurs during refuse compaction and activates the reverse start winding to cause the retraction of the ram assembly. The preferred embodiment eliminates the centrifugal switch for improved motor control in the region of the motor speed-torque curve of FIG. 3 near the breakdown torque. While the motor phase monitoring technique of the present invention facilitates complete elimination of the motor centrifugal switch or start relay, it will be appreciated by those skilled in the art that a traditional motor centrifugal switch or start relay could be retained and used in conjunction with a TRIAC on motor winding 104a without departure from the spirit of the invention.

In summary, the operator of the refuse compactor 10 selects HIGH, MEDIUM or LOW force on the cycle selector 28 and then actuates the start button 30. Or, alternatively, the operator may initiate a cycle and select HIGH, MEDIUM or LOW anytime before the start of actual trash compaction. The ferrite core 114 acts as a sensor, sampling the lagging phase angle of the motor main winding current throughout the refuse compaction stroke. As described above, the phase samples begin to decrease at the onset of actual refuse compaction and continue to decrease until the load torque exceeds the motor breakdown torque, at which time the phase samples begin to increase.

If the LOW force has been selected, the main program 300 terminates the stroke as soon as the phase samples fall below a threshold defined at the start of the cycle by a locked rotor main winding phase sample acquired prior to starting the motor.

If MEDIUM force has been selected, the main program terminates the stroke as soon as compaction forces exceed the main winding breakdown torque. The medium force cycle corresponds to the torque, and therefore the compaction, achieved by prior compactor designs.

If HIGH force has been selected, the main program 300 reactivates the start winding or auxiliary winding 104 at the time of maximum compaction, thereby achieving approximately twenty percent more compaction force than prior compactors using the same motor 100.

The control of the present invention also provides additional features at no extra manufacturing cost as a result of additional programming steps. The control detects the absence of compaction as well as a full bag condition since the control can determine the time when compaction occurs.

It will be appreciated by those skill in the art that the techniques, circuitry, and logic described above may be used in whole or in part to control other types of motors, or to control appliances other than a trash compactor. For example, the control logic may be used to determine when any similar motor 100 is stalling and, if desired, increase, stop, or reverse the torque output of the motor.

The above constitutes a detailed description of the best mode contemplated by the inventor, at the time of filing, for carrying out the present invention. Variations and modifications from these details will be apparent to hose skilled in the art and such variations and modifications are included within the intended scope of the claims appended hereto.

I claim:

1. A motor control for a refuse compact having a refuse receptacle, a ram reciprocable into and out of said refuse receptacle, a split phase induction drive motor with a start winding and a run winding, an AC power supply selectively supplying said drive motor with a line voltage alternating at a line frequency, and a drive assembly interconnecting said motor with said ram such that said ram is effectively driven into and out of said refuse receptacle by operation of said motor, said control comprising:

detection means for detecting the onset of stall in said motor indicative of the onset of compaction of refuse in said refuse receptacle; wherein said detection means further comprises means for periodically measuring the phase angle of said run winding during energization of said run winding; and means for controlling the operation of said refuse compactor in response to said detection of the onset of stall in said motor, said means for controlling the operation of said refuse compactor comprising means for energizing said start winding in response to a predetermined change in said phase angle measurement indicative of the compaction of refuse in said refuse receptacle.

2. The motor control of claim 1 wherein said means for controlling the operation of said refuse compactor in response to a predetermined change in said phase angle measurement compares the most recent phase angle measurement with a locked rotor phase angle measurement and discontinues supply of current to said run winding when said most recent phase angle measurement is approximately equal to said locked rotor measurement.

3. The motor control of claim 1 wherein said means for controlling the operation of said refuse compactor in response to a predetermined change in said phase angle measurement compares the most recent motor phase angle measurement with the previous minimum motor phase angle measurement and discontinues supply of current to said run winding when said most recent motor phase angle measurement is larger than said previous minimum motor phase angle measurement.

4. The motor control of claim 1 wherein said means for controlling the operation of said refuse compactor further comprises:
  calculator means, response to said phase angle measurements from said means for measuring, said calculator means comprising means for comparing at least two of said phase angle measurements and generating a motor control signal upon detection of a predetermined change in said phase angle measurement characteristic of the onset of stall in said motor; and
  power switching means for controlling the supplying or power to at least one of said motor windings in response to said motor control signal.

5. The motor control of claim 1 wherein said means for controlling the operation of said refuse compactor in response to a predetermined change in said phase angle measurement compares the most recent phase angle measurement with a locked rotor phase angle measurement and discontinues supply of current to said run winding when said most recent measurement is approximately equal to said locked rotor measurement.

6. A motor control for a refuse compactor having a refuse receptacle, a ram reciprocable into and out of said refuse receptacle, a split phase induction drive motor with a start winding and a run winding, an AC power supply selectively supplying said drive motor with a line voltage alternating at a line frequency, and a drive assembly interconnecting said motor with said ram such that said ram is effectively driven into and out of said refuse receptacle by operation of said motor, said control comprising:
  detection means for detecting the onset of stall in said motor indicative of the onset of compaction of refuse in said refuse receptacle; wherein said detection means further comprises means for periodically measuring the phase angle of said run winding during energization of said run winding;
  means for controlling the operation of said refuse compactor in response to said detection of the onset of stall in said motor;
  said means for periodically measuring the phase angle of said run winding during energization of said run winding further comprising:
  transformer means comprising a transformer winding having at least one turn of said run winding of said motor, said transformer providing a voltage signal;
  a current pulse circuit responsive to said voltage signal and providing a current pulse output in response to zero crossings of said motor winding;
  a volt pulse circuit responsive to the line voltage to provide a volt pulse output corresponding to the line frequency;
  calculator means responsive to said current pulse output and said volt pulse output to calculate the lagging phase angle therebetween; and
  voltage regulator means for supplying an unregulated DC bias voltage to said current pulse circuit and for supplying a full wave rectified voltage to said voltage pulse circuit, said unregulated DC bias voltage adjusting the sensitivity of said current pulse circuit for the effect of line voltage variation on said run winding.

7. A motor control for a refuse compactor having a refuse receptacle, a ram reciprocable into and out of said refuse receptacle, a split phase induction drive motor with a start winding and a run winding, an AC power supply selectively supplying said drive emotor with a line voltage alternating at a line frequency, and a drive assembly interconnecting said motor with said ram such that said ram is effectively driven into said out of said refuse receptacle by operation of said motor, said control comprising:
  detection means for detecting the onset of stall in said motor indicative of the onset of compaction of refuse in said refuse receptacle; wherein said detection means further comprises means for periodically measuring the phase angle of said run winding during energization of said run winding; and
  means for controlling the operation of said refuse compactor in response to said detection of the onset of stall in said motor, said means for controlling the operation of said refuse compactor further comprises:
  calculator means, responsive to said phase angle measurements from said means for measuring, said calculator means comprising means for comparing at least two of said phase angle measurements and selectively generating a first motor control signal upon detection of a first predetermined change in said measurement characteristic of the onset of stall in said motor and selectively generating a second motor control signal upon detection of a second predetermined change in said measurement characteristic of the onset of stall in said motor;
  first power switching means for discontinuing the supplying of power to said run windings in response to said first motor control signal; and
  second power switching means for discontinuing the supplying of power to said run windings in response to said second motor control signal.

8. A motor control for a refuse compactor having a refuse receptacle, a ram reciprocable into and out of said refuse receptacle, a split phase induction drive motor with a start winding and a run winding, an AC power supply selectively supplying said drive motor with a line voltage alternating at a line frequency, and a drive assembly interconnecting said motor with said ram such that said ram is effectively driven into and out of said refuse receptacle by operation of said motor, said control comprising:

detection means for detecting the onset of stall in said motor indicative of the onset of compaction of refuse in said refuse receptacle; wherein said detection means further comprises means for periodically measuring the phase angle of said run winding during energization of said run winding; and means for controlling the operation of said refuse compactor in response to said detection of the onset of stall in said motor, said means for controlling the operation of said refuse compactor further comprises:

first calculator means, responsive to said phase angle measurements from said means for measuring, said first calculator means further comprising means for comparing at least two of said phase angle measurements and selectively generating a first motor control signal upon detection of a predetermined change in said measurement characteristic of the onset of stall in said motor;

second calculator means, responsive to said phase angle measurements, for comparing the most recent phase angle measurement with a locked rotor phase angle measurement and selectively generating a second motor control signal upon detection of a current phase angle measurement approximately equal to said locked rotor phase angle measurement;

first power switching means for discontinuing the supplying of power to said run winding in response to said first motor control signal;

second power switching means for initiating the supplying of power to said start winding in response to said second motor control signal; and selector means for selecting said first or said second calculator means.

9. A motor control for a refuse compactor having a refuse receptacle, a ram reciprocable into and out of said refuse receptacle, a drive motor with a start winding and a drive winding, and a drive assembly interconnecting said motor with said ram such that said ram is effectively driven into and out of said refuse receptacle by operation of said motor, said control comprising:

detection means for detecting the onset of stall in said motor indicative of the onset of compaction of refuse in said refuse receptacle;

means for temporarily increasing the torque of said motor in response to said detection of the onset of stall in said motor; said means for temporarily increasing the torque of said motor further comprising:

first control means for providing a first predetermined maximum torque level upon the detection of the onset of stalling of said motor;

second control means for providing a second predetermined maximum torque level upon the detection of the onset of stalling of said motor; and selector means for selecting said first or said second control means.

10. The motor control of claim 9 further comprising:
timing means for measuring the duration of operation of said motor prior to the onset of compacting; and
load detection means responsive to said timing means for estimating the volume of refuse in said refuse receptacle.

11. The control of claim 10 further comprising indicator means for indicating the detection of a no-load condition, corresponding to failure of said detecting means to detect the onset of stalling of said motor after a predetermined period of time.

12. The control of claim 10 further comprising indicator means for indicating the detection of a full refuse receptacle, corresponding to the detection of the onset of stalling prior to a predetermined period of time.

13. The motor control of claim 10 further comprising indicator means for indicating said volume of refuse in said refuse receptacle estimated by said load measuring means.

14. The control of claim 9 wherein said motor has at least two windings, said means for increasing the torque of said motor in response to the detection of the onset of compaction comprises means for temporarily activating one of said at least two windings winding upon detection of the onset of compaction.

15. The control of claim 9 further comprising indicator means for indicating the detection of a no-load condition, corresponding to failure of said detecting means to detect the onset of stalling of said motor after a predetermined period of time.

16. The control of claim 9 further comprising indicator means for indicating the detection of a full refuse receptacle, corresponding to the detection of the onset of stalling prior to a predetermined period of time.

17. The motor control of claim 9 further comprising:
emergency stop signal means for signalling that an emergency condition exists;
means for instantaneously stopping said ram and for maintaining said ram in a fixed position within said refuse receptacle in response to actuation of said emergency stop signal means;
release signal means; and
means for driving said ram out of said refuse receptacle in response to actuation of said release signal means.

18. A motor control for a refuse compactor having a refuse receptacle, a ram reciprocable into and out of said refuse receptacle, a split phase induction drive motor with a start winding and a run winding, an AC power supply selectively supplying said drive motor with a line voltage alternating at a line frequency, and a drive assembly interconnecting said motor with said ram such that said ram is effectively driven into and out of said refuse receptacle by operation of said motor, said control comprising:

detection means for detecting the onset of stall in said motor indicative of the onset of compaction of refuse in said refuse receptacle; wherein said detection means further comprises means for periodically measuring the phase angle of said run wining during energization of said run winding; and means for controlling the operation of said refuse compactor in response to said detection of the onset of stall in said motor; said means for controlling the operation of said refuse compactor further comprising means for temporarily increasing the torque of said motor in response to the detection of the onset of compaction; further wherein said means for increasing the torque of said motor in response to the detection of the onset of compaction further comprises means for temporarily activating the start winding upon detection of the onset of compaction.

19. A motor control for a refuse compactor having a refuse receptacle, a ram reciprocable into and out of said refuse receptacle, a split phase induction drive motor with a start winding and a run winding, an AC power supply selectively supplying said drive motor with a line voltage alternating at a line frequency, and a drive assembly interconnecting said motor with said ram such that said ram is effectively driven into and out of said refuse receptacle by operation of said motor, said control comprising:

detection means for detecting the onset of stall in said motor indicative of the onset of compaction of refuse in said refuse receptacle; wherein said detection means further comprises means for periodically measuring the phase angle of said run winding during energization of said run winding; and means for controlling the operation of said refuse compactor in response to said detection of the onset of stall in said motor;

and further wherein said motor has a run winding having a characteristic speed-torque curve and wherein the phase angle of said run winding is dynamically indicative of the location of the motor along said speed-torque curve during operation of said motor, and further wherein said means for detecting the onset of compaction comprises:

means for storing said phase angle measurements; and means for comparing said stored phase angle measurements to detect a predetermined change in said phase angle indicative of the onset of stall of said motor.

20. The motor control of claim 19 wherein said means for periodically measuring the phase angle of said run winding during energization of said run winding further comprises:

transformer means comprising a transformer winding having at least one turn of said run winding of said motor, said transformer providing a voltage signal;

a current pulse circuit responsive to said voltage signal and providing a current pulse output in response to zero crossings of said motor winding;

a volt pulse circuit responsive to the line voltage to provide a volt pulse output corresponding to the line frequency; and calculator means responsive to said current output and said volt pulse output to calculate the lagging phase angle therebetween.

21. The motor control of claim 19 wherein said means for controlling the operation of said refuse compactor further comprises means for controlling he duration of operation of said motor in response to said detection means detecting the onset of stalling.

22. The moor control of claim 19 wherein said means for controlling the operation of said refuse compactor further comprises means for temporarily increasing the torque of said motor in response to the detection of the onset of compaction.

23. The motor control of claim 19 wherein said means for controlling the operation of said refuse compactor in response to said detection of the onset of stall in said motor comprises:

first control means for providing a first predetermined maximum torque level upon the detection of the onset of stalling of said motor;

second control means for providing a second predetermined maximum torque level upon the detection of the onset of stalling of said motor; and selector means for selecting said first or said second control means.

24. The motor control of claim 19 further comprising:

timing means for measuring the duration of operation of said motor prior to the onset of compacting; and load measuring means responsive to said timing means for estimating the volume of refuse in said refuse receptacle.

25. The motor control of claim 24 further comprising indicator means for indicating said volume of refuse in said refuse receptacle estimated by said load measuring means.

26. The motor control of claim 19 further comprising indicator means for indicating the detection of a no-load condition, corresponding to failure of said detecting means to detect the onset of stalling of said motor after a predetermined period of time.

27. The motor control of claim 19 further comprising indicator means for indicating the detection of a full refuse receptacle, corresponding to the detection of the onset of stalling prior to a predetermined period of time.

28. The motor control of claim 19 wherein said means for controlling the operation of said refuse compactor in response to a predetermined change in said phase angle measurement compares the most recent motor phase angle measurement with the previous minimum motor phase measurement and discontinues supply of current to said rum winding when said most recent motor phase angle measurement is larger than said previous minimum motor phase measurement.

29. A motor control for a refuse compactor having a refuse receptacle, a ram reciprocable into and out of said refuse receptacle, a split phase induction drive motor with a start winding and a run winding, an AC power supply selectively supplying said drive motor with a line voltage alternating at a line frequency, and a drive assembly interconnecting said motor with said ram such that said ram is effectively driven into and out of said refuse receptacle by operation of said motor, said control comprising:

detection means for detecting the onset of stall in said motor indicative of the onset of compaction of refuse in said refuse receptacle; wherein said detection means further comprises means for periodically measuring the phase angle of said run winding during energization of said run winding; and means for controlling the operation of said refuse compactor in response to said detection of the onset of stall in said motor; wherein said means for controlling the operation of said refuse compactor in response to a predetermined change in said phase angle measurement compares the most recent phase angle measurement with a locked rotor phase angle measurement and discontinues supply of current to said run winding when said most recent measurement is approximately equal to said locked rotor measurement;

further wherein said run winding has a characteristic speed-torque curve and wherein the phase angle of said run winding is dynamically indicative of the location of the motor along said speed-torque curve during operation of said motor, and further wherein said means for detecting the onset of compaction comprises:

means for storing said phase angle measurement; and means for comparing said stored phase angle measurements to detect a predetermined change in said phase angle indicative of the onset of stall of said motor.

30. A refuse compactor comprising:
a refuse receptacle;
ram means reciprocable into and out of said refuse receptacle;
a motor having a run winding;
drive means interconnecting said motor with said ram means such that said ram means is selectively driven into and out of said refuse receptacle by operation of said motor;
means for detecting the onset of stall of said motor indicative of the onset of compaction of refuse in said refuse receptacle;
means for increasing the torque of said motor in response to the detection of the onset of compaction;
emergency stop signal means for signalling that an emergency condition exists;
means for instantaneously stopping said ram means and for maintaining said ram means in a fixed position within said refuse receptacle in response to actuation of said emergency stop signal means;
release signal means; and
means for driving said ram means out of said refuse receptacle in response to actuation of said release signal means.

31. The refuse compactor of claim 30 wherein said motor has a start winding and wherein said means for increasing the torque of said motor in response to the detection of the onset of compaction comprises means for temporarily activating the start winding upon detection of the onset of compaction.

32. The refuse compactor of claim 30 further comprising:
manually operable start means for signalling that compaction is desired, said emergency stop signal means and said release signal means both consisting of said start means; and
control means responsive to said start means to energize said motor such as to advance said ram means into said refuse receptacle.

33. The refuse compactor of claim 31 further comprising:
timing means for measuring the duration of operation of said motor prior to the onset of compacting; and
load measuring means responsive to said timing means for estimating the volume of refuse in said refuse receptacle.

34. The refuse compactor of claim 33 further comprising:
first indicator means for indicating the detection of a no-load condition, corresponding to failure of said detecting means to detect the onset of stalling of said motor after a first predetermined period of time; and
second indicator means for indicating the detection of a full refuse receptacle, corresponding to the detection of the onset of stalling prior to a second predetermined period of time.

35. The refuse compactor of claim 31 wherein said means for detecting the onset of compacting further comprises:
means for measuring the phase angle of said run winding during energization of said run winding; and
means for storing said measurements of said phase angle;
means for comparing two or more of said stored phase angle measurements.

36. A refuse compactor comprising:
a refuse receptacle;
ram means reciprocable into and out of said refuse receptacle;
a motor having a run winding;
drive means interconnecting said motor with said ram means such that said ram means is selectively driven into and out of said refuse receptacle by operation of said motor;
means for detecting the onset of stall of said motor indicative of the onset of compaction of refuse in said refuse receptacle wherein said means for detecting the onset of compacting further comprises:
means for measuring the phase angle of said run winding during energization of said run winding; and
means for storing said measurements of said phase angle;
means for comparing two or more of said stored phase angle measurements;
means for controlling the operation of said motor in response to the detection of the onset of compaction; wherein said means for controlling the operation of said motor in response to a predetermined change in said phase angle measurement compares the most recent phase angle measurement with a locked rotor phase angle measurement and discontinues supply of current to said run winding when said most recent measurement is approximately equal to said locked rotor measurement.

37. The refuse compactor of claim 34 wherein said means for controlling the operation of said motor in response to a predetermined change in said phase angle measurement compares the most recent motor phase angle measurement with the previous minimum motor phase angle measurement and discontinues supply of current to said run winding when said most recent motor phase angle measurement is larger than said previous minimum motor phase angle measurement.

38. A refuse compactor comprising:
a refuse receptacle;
ram means reciprocable into and out of said refuse receptacle;
a motor having a run winding;
drive means interconnecting said motor with said ram means such that said ram means is selectively driven into and out of said refuse receptacle by operation of said motor;
means for detecting the onset of stall of said motor indicative of the onset of compaction of refuse in said refuse receptacle wherein said means for detecting the onset of compacting further comprises:
means for measuring the phase angle of said run winding during energization of said run winding; said means for measuring the phase angle of said run winding during energization of said run winding further comprises:
transformer means comprising a transformer winding having at least one turn of said run winding of said motor, said transformer providing a voltage signal;
a current pulse circuit responsive to said voltage signal and providing a current pulse output in response to zero crossings of said run winding;

a volt pulse circuit responsive to the line voltage to provide a volt pulse output corresponding to the line frequency; and calculator means responsive to said current pulse output and said volt pulse output to calculate the lagging phase angle therebetween;

means for storing said measurements of said phase angle; and means for comparing two or more of said stored phase angle measurements;

means for controlling the operation of said motor in response to the detection of the onset of compaction.

39. The refuse compactor of claim 38 wherein said detecting means further comprises means for periodically measuring the phase angle of said run winding during energization of said run winding.

40. A refuse compactor comprising:

a refuse receptacle;

ram means reciprocable into and out of said refuse receptacle;

a motor having a run winding;

drive means interconnecting said motor with said ram means such that said ram means is selectively driven into and out of said refuse receptacle by operation of said motor;

means for detecting the onset of stall of said motor indicative of the onset of compaction of refuse in said refuse receptacle wherein said means for detecting the onset of compacting further comprises:

means for measuring the phase angle of said run winding during energization of said run winding; and means for storing said measurements of said phase angle;

means for comparing two or more of said stored phase angle measurements;

means for controlling the operation of said motor in response to the detection of the onset of compaction; said means for controlling the operation of said motor further comprises:

calculator means, responsive to said phase angle measurements from said means for measuring, said calculator means comparing at least two of said phase angle measurements and generating a motor control signal upon detection of a predetermined change in said measurement characteristic of the onset of stall in said motor; and power switching means for controlling the supply of power to at least one of said motor windings in response to said motor control signal.

41. The refuse compactor of claim 40 further comprising:

means for maintaining said ram means in a fixed position against said refuse and within said refuse receptacle for a predetermined period of time after said motor has ceased driving said ram means into said receptacle; and means for driving said ram means out of said refuse receptacle after said predetermined period of time.

42. A refuse compactor comprising:

a refuse receptacle;

ram means reciprocable into and out of said refuse receptacle;

a motor having a run winding;

drive means interconnecting said motor with said ram means such that said ram means is selectively driven into and out of said refuse receptacle by operation of said motor;

means for detecting the onset of stall of said motor indicative of the onset of compaction of refuse in said refuse receptacle wherein said means for detecting the onset of compacting further comprises:

means for measuring the phase angle of said run winding during energization of said run winding; and means for storing said measurements of said phase angle; and means for comparing two or more of said stored phase angle measurements; and means for controlling the operation of said motor in response to the detection of the onset of compaction;

and further wherein said means for measuring the phase angle of said run winding during energization of said run winding further comprises:

transformer means comprising a transformer winding having at least one turn of said run winding of said motor, said transformer providing a voltage signal;

a current pulse circuit responsive to said voltage signal and providing a current pulse output in response to zero crossings of said run winding;

a volt pulse circuit responsive to the line voltage to provide a volt pulse output corresponding to the line frequency;

voltage regulator means for supplying an unregulated DC bias voltage to said current pulse circuit and for supplying a full wave rectified voltage to said volt pulse circuit, said unregulated DC bias voltage adjusting the sensitivity of said current pulse circuit for the effect of line voltage variation on said run winding; and first calculator means responsive to said current pulse output and said volt pulse output to calculate the lagging phase angle therebetween;

and still further wherein said means for controlling the operation of said motor further comprises:

second calculator means, responsive to said phase angle measurements from said first calculator means, for comparing at least two of said phase angle measurements and generating a motor control signal upon detection of a predetermined change in said measurement characteristic of the onset of stall in said motor; and power switching means for controlling the supply of power to at least one of said motor windings in response to said motor control signal.

43. The refuse compactor of claim 42 wherein said means for controlling said refuse compactor in response to said phase angle measurement comprises:

first control means for providing a first predetermined maximum torque level upon the detection of the onset of stalling of said motor;

second control means for providing a second predetermined maximum torque level upon the detection of the onset of stalling of said motor; and selector means for selecting said first or said second control means.

44. The refuse compactor of claim 43 wherein:

said motor further comprises a start winding;

said first control means comprises means for energizing said start winding in response to a predetermined change in said phase angle measurement indicative of the compaction of refuse in said refuse receptacle; and said second control means comprises comparison means for comparing the most recent phase angle measurement with a locked rotor phase angle measurement and discontinues supply of current to said run winding when said most recent measurement is approximately equal to said locked rotor measurement.

45. The refuse compactor of claim 43 wherein:

said motor further comprises a start winding;

said first control means comprises means for energizing said start winding in response to a predetermined change in said phase angle measurement indicative of the compaction of refuse in said refuse receptacle; and said second control means comprises comparison means for comparing the most recent phase angle measurement with a retained minimum phase angle measurement and discontinues supply of current to said run winding when said most recent measurement is significantly greater than said retained minimum phase angle measurement.

46. A control method for a refuse compactor having a refuse receptacle, ram means reciprocable into and out of said refuse receptacle, a motor having a run winding and a start winding, and a drive assembly interconnecting said motor with said ram assembly such that said ram assembly is selectively driven into and out of said refuse receptacle by operation of said motor, said control method comprising:

detecting the onset of compaction of refuse in said refuse receptacle; and increasing the torque of said motor in response to the detection of the onset of compaction; wherein said step of increasing the torque of said motor in response to the detection of the onset of compaction comprises temporarily activating the start winding upon detection of the onset of compaction.

47. The control method of claim 46 further comprising the steps of:

maintaining said ram means in a fixed position within said refuse receptacle for a predetermined period of time after said motor has stalled; and driving said ram means out of said refuse receptacle after said predetermined period of time.

48. A control method for a refuse compactor having a refuse receptacle, ram means reciprocable into and out of said refuse receptacle, a motor having a run winding having a characteristic speed-torque curve and wherein the phase angle of said run winding is dynamically indicative of the location of the motor along said speed-torque curve during operation of said motor, and a drive assembly interconnecting said motor with said ram assembly such that said ram assembly is selectively driven into and out of said refuse receptacle by operation of said motor, said control method comprising:

detecting the onset of compaction of refuse in said refuse receptacle; wherein said step of detecting the onset of compaction comprises:

periodically measuring the phase angle of said run winding;

storing said phase angle measurements; and comparing said stored phase angle measurements to detect a predetermined change in said phase angle indicative of the onset of stall of said motor; and increasing the torque of said motor in response to the detection of the onset of compaction.

49. A diagnostic apparatus for a refuse compactor having a refuse receptacle, a ram reciprocable into and out of said refuse receptacle, a motor with a start winding and a run winding, and a drive assembly interconnecting said motor with said ram such that said ram is effectively driven into and out of said refuse receptacle by operation of said motor, said diagnostic apparatus comprising:

detection means for detecting the onset of stall in said motor indicative of the onset of compaction of refuse in said refuse receptacle; and timing means for measuring the duration of operation of said motor prior to the onset of stall; and load measuring means responsive to said timing means for estimating the volume of refuse in said refuse receptacle;

said detection means further comprises:

means for measuring motor phase angle;

means for temporarily storing phase angle measurements during each cycle of operation of said refuse compactor;

means for comparing said stored phase angle measurements; and means for detecting a characteristic increase in motor phase angle above the minimum phase angle measured during the current operational cycle of said refuse compactor.

50. The diagnostic apparatus of claim 49 wherein said load measuring means further comprises indicator means for indicating the detection of a no-load condition, corresponding to failure of said detecting means to detect the onset of stall of said motor after a predetermined period of time.

51. The diagnostic apparatus of claim 49 wherein said load measuring means further comprises indicator means for indicating the detection of a full refuse receptacle, corresponding to the detection of the onset of stall prior to a predetermined period of time.

52. The diagnostic apparatus of claim 49 further comprising control means responsive to said load measuring means for halting the operation of said motor in the event of a failure of said detecting means to detect the onset of stalling of said motor after a predetermined period of time.

53. The diagnostic apparatus of claim 49 further comprising indicator means for indicating said volume of refuse in said refuse receptacle estimated by said load measuring means.

54. The diagnostic apparatus of claim 49 further comprising:

emergency stop signal means for signalling that an emergency condition exists;

means for instantaneously stopping said ram and for maintaining said ram in a fixed position within said refuse receptacle in response to actuation of said emergency stop signal means;

release signal means; and means for driving said ram out of said refuse receptacle in response to actuation of said release signal means.

55. The diagnostic apparatus of claim 49 further comprising means for controlling the operation of said refuse compactor in response to said detection of the onset of stall in said motor, wherein said means for controlling the operation of said motor further comprises:

first calculator means, responsive to said phase angle measurements, said first calculator means comprising means for comparing at least two of said phase angle measurements and generating a first motor control signal upon detection of a first predetermined change in said phase angle measurement characteristic of the onset of stall in said motor; and first power switching means for controlling the supplying of power to at least one of said motor windings in response to said first motor control signal.

56. In a motor control for an appliance having a split phase induction drive motor with a start winding and a run winding and an AC power supply selectively supplying said drive motor with a line voltage alternating at a line frequency, the improvement comprising means for periodically measuring the phase angle of said run winding during energization of said run winding comprising:

transformer means comprising a transformer winding having at least one turn of said run winding of said motor, said transformer providing a voltage signal;

a current pulse circuit responsive to said voltage signal and providing a current pulse output in response to zero crossings of said run winding;

a volt pulse circuit responsive to the line voltage to provide a volt pulse output corresponding to the line frequency; and calculator means responsive to said current pulse output and said volt pulse output to calculate the lagging phase angle therebetween; and voltage regulator means for supplying an unregulated DC bias voltage to said current pulse circuit and for supplying a full wave rectified voltage to said volt pulse circuit, said unregulated DC bias voltage adjusting the sensitivity of said current pulse circuit for the effect of line voltage variation on said run winding.

57. A control for a refuse compactor having a refuse receptacle, a ram reciprocable into and out of said refuse receptacle, a split phase induction drive motor with a start winding and a run winding, an AC power supply selectively supplying said drive motor with a line voltage alternating at a line frequency, and a drive assembly interconnecting said motor with said ram such that said ram is effectively driven into and out of said refuse receptacle by operation of said motor, said control comprising:

detection means for detecting the onset of stall in said motor indicative of the onset of compaction of refuse in said refuse receptacle, wherein said detection means further comprises means for periodically measuring the phase angle of said run winding during energization of said run winding; and means for controlling the operation of said refuse compactor in response to said detection of the onset of stall in said motor, wherein said means for controlling the operation of said motor further comprises:

first calculator means, responsive to said phase angle measurements from said means for measuring, first power switching means for controlling the supplying of power to at least one of said motor windings in response to said first motor control signal.

58. The control of claim 57 wherein said means for controlling the operation of said motor further comprises:

said first calculator means further selectively generating a second motor control signal upon detection of a second predetermined change in said measurement characteristic of the onset of stall in said motor;

power switching means for controlling the supplying of power to said run windings in response to said second motor control signal.

59. The control of claim 56 wherein said power switching means further comprises:

said first power switching means discontinuing the supplying of power to said run windings in response to said first motor control signal; and second power switching means for discontinuing the supplying of power to said run windings in response to said second motor control signal.

60. The motor control of claim 57 wherein said means for controlling the operation of said motor further comprises said first power switching means discontinuing the supplying of power to said run windings in response to said first motor control signal.

61. The motor control of claim 57 wherein said means for controlling the operation of said motor further comprises:

second calculator means, responsive to said phase angle measurements, for comparing the most recent phase angle measurement with a locked rotor phase angle measurement and selectively generating a second motor control signal upon detection of a current phase angle measurement approximately equal to said locked rotor phase angle measurement;

second power switching means for controlling the supply of power to said start winding in response to said second motor control signal.

62. The motor control of claim 61 wherein said means for controlling the operation of said motor further comprises selector means for selecting said first or said second calculator means.

63. The motor control of claim 61 wherein said means for controlling the operation of said motor further comprises:

said first power switching means discontinuing the supply of power to said run winding in response to said first motor control signal;

said second power switching means initiating the supply of power to said start winding in response to said second motor control signal.

64. The motor control of claim 63 wherein said means for controlling the operation of said motor further comprises selector means for selecting said first or said second calculator means.

65. The refuse compactor of claim 31 further comprising:

means for maintaining said ram means in a fixed position against said refuse and within said refuse receptacle for a predetermined period of time after said motor has ceased driving said ram means into said receptacle; and means for driving said ram means out of said refuse receptacle after said predetermined period of time.

* * * * *